United States Patent
Xu et al.

(10) Patent No.: US 11,560,615 B2
(45) Date of Patent: Jan. 24, 2023

(54) MASK AND MANUFACTURING METHOD THEREOF, FINE METAL MASK, MASK DEVICE AND USE METHOD THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Peng Xu, Beijing (CN); Tong Niu, Beijing (CN); Fengli Ji, Beijing (CN); Jianpeng Wu, Beijing (CN); Guodong Zhang, Beijing (CN); Yu Zhao, Beijing (CN); Panting He, Beijing (CN); Sen Du, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 79 days.

(21) Appl. No.: 16/959,409

(22) PCT Filed: Nov. 29, 2019

(86) PCT No.: PCT/CN2019/122085
§ 371 (c)(1),
(2) Date: Jun. 30, 2020

(87) PCT Pub. No.: WO2021/036067
PCT Pub. Date: Mar. 4, 2021

(65) Prior Publication Data
US 2021/0404049 A1    Dec. 30, 2021

(30) Foreign Application Priority Data

Aug. 28, 2019  (CN) .......................... 201910801463.0
Aug. 28, 2019  (CN) .......................... 201921410333.6

(51) Int. Cl.
*C23C 14/04*         (2006.01)
*B05C 17/06*         (2006.01)
(Continued)

(52) U.S. Cl.
CPC ............ *C23C 14/042* (2013.01); *B05C 17/06* (2013.01); *B05C 21/005* (2013.01); *H01L 51/0011* (2013.01); *C23C 14/24* (2013.01)

(58) Field of Classification Search
CPC .......................... H01L 51/0011; C23C 14/042
See application file for complete search history.

(56) References Cited

U.S. PATENT DOCUMENTS 9,896,759 B2    2/2018  Wu et al.
10,663,857 B2    5/2020  Lv et al.
2018/0155818 A1*  6/2018  Mu .......................... C23C 14/12
2019/0093216 A1*  3/2019  Zhou ..................... C23C 16/042
(Continued)

FOREIGN PATENT DOCUMENTS

CN    104561892 A    4/2015
CN    204434717 U    7/2015
(Continued)

*Primary Examiner* — Dah-Wei D. Yuan
*Assistant Examiner* — Stephen A Kitt

(57) ABSTRACT

A mask, a manufacturing method thereof, a fine metal mask, a mask device and a use method thereof are provided. The mask includes at least one opening region and a shielding part surrounding and defining the at least one opening region. The shielding part includes a main part and at least one protrusion, in each opening region, the protrusion is protruded towards the opening region on a side of the main part facing the opening region; the main part includes an edge disposed on a side of the protrusion opposite to the opening region and with an extension direction being a same (Continued)

with an extension direction of the protrusion, the protrusion and a portion of the main part disposed between the edge and the protrusion includes a thinning portion with a thickness being less than a thickness of other portions of the shielding part.

19 Claims, 9 Drawing Sheets

(51) Int. Cl.
*B05C 21/00* (2006.01)
*H01L 51/00* (2006.01)
*C23C 14/24* (2006.01)

(56) References Cited

U.S. PATENT DOCUMENTS

2019/0203336 A1* 7/2019 Xu ..................... C23C 14/24
2019/0233931 A1  8/2019 Zhang et al.
2019/0242012 A1* 8/2019 Wang ................... B05C 21/005
2019/0276927 A1* 9/2019 Wang ................... C23C 14/042
2019/0368028 A1* 12/2019 Yamabuchi ......... H01L 51/0001

FOREIGN PATENT DOCUMENTS

| | | | |
|---|---|---|---|
| CN | 105154823 A | | 12/2015 |
| CN | 106019819 A | | 10/2016 |
| CN | 206188876 U | | 5/2017 |
| CN | 108251796 A | | 7/2018 |
| CN | 109321880 A | * | 2/2019 |
| CN | 109321880 A | | 2/2019 |
| JP | S6247476 A | | 3/1987 |
| JP | 2017020068 A | | 1/2017 |
| JP | 6519395 B2 | | 5/2019 |

* cited by examiner

MASK AND MANUFACTURING METHOD THEREOF, FINE METAL MASK, MASK DEVICE AND USE METHOD THEREOF

The application claims priority to the Chinese patent application No. 201910801463.0, filed Aug. 28, 2019, and the Chinese patent application No. 201921410333.6, filed Aug. 28, 2019, the disclosures of which are incorporated herein by reference as part of the application.

TECHNICAL FIELD

The embodiments of the present disclosure relate to a mask, a manufacturing method thereof, a fine metal mask (FMM), a mask device and a use method thereof.

BACKGROUND

With the popularity of electronic display products, users' requirements on the functions and the appearance of the electronic display products have been further improved. In order to meet different actual needs of users, the appearance or a display region of the electronic display product sometimes needs to be designed into irregular or special shape. Correspondingly, functional layers, structural layers and the like in the electronic display product also need to have irregular or special shapes.

SUMMARY

At least one embodiment of the present disclosure provides a mask, the mask comprises at least one opening region and a shielding part surrounding and defining the at least one opening region, the shielding part includes a main part and at least one protrusion, in each opening region of the at least one opening region, the protrusion is protruded towards the opening region on a side of the main part facing the opening region, the main part includes an edge which is disposed on a side of the protrusion opposite to the opening region and of which an extension direction is a same with an extension direction of the protrusion, at least one of the protrusion and a portion of the main part disposed between the edge and the protrusion includes a thinning portion, and a thickness of the thinning portion is less than a thickness of other portions of the shielding part.

For example, in the mask provided by at least one embodiment of the present disclosure, the thinning portion is a recessed portion; and a thickness of a portion of the shielding part at the recessed portion is less than a thickness of other portions of the shielding part.

For example, in the mask provided by at least one embodiment of the present disclosure, the recessed portion is disposed in the protrusion; a center of an orthographic projection of the recessed portion on the protrusion coincides with a center of the protrusion, and a shape of the recessed portion is a same with a shape of the protrusion.

For example, in the mask provided by at least one embodiment of the present disclosure, the recessed portion is disposed on the portion of the main part disposed between the edge and the protrusion; and a connecting line between a center of the recessed portion and a center of the protrusion is parallel to a protruding direction of the protrusion.

For example, in the mask provided by at least one embodiment of the present disclosure, in the extension direction of the protrusion, a size of the recessed portion is a same with a size of the protrusion; and a shape of the recessed portion is a same with a shape of the protrusion.

For example, in the mask provided by at least one embodiment of the present disclosure, a ratio of the thickness of the portion of the shielding part at the recessed portion to the thickness of other portions of the shielding part is greater than or equal to 0.8.

For example, in the mask provided by at least one embodiment of the present disclosure, the portion of the main part disposed between the edge and the protrusion is communicated with the thinning portion in the protrusion.

For example, in the mask provided by at least one embodiment of the present disclosure, the protrusion and the main part are integrally formed.

For example, in the mask provided by at least one embodiment of the present disclosure, a shape of the protrusion is square, semicircular or drop-shaped.

For example, the mask provided by at least one embodiment of the present disclosure further comprises a plurality of fixing parts disposed at a periphery of the shielding part, and the plurality of fixing parts are connected with the shielding part and are protruded along a direction away from the at least one opening region in a plane parallel to a surface of the mask.

For example, in the mask provided by at least one embodiment of the present disclosure, the fixing part and the shielding part are integrally arranged.

For example, the mask provided by at least one embodiment of the present disclosure comprises a plurality of opening regions, and the plurality of opening regions are arranged in an array, and the shielding part surrounds and defines each opening region of the plurality of opening regions.

For example, in the mask provided by at least one embodiment of the present disclosure, the shielding part includes a plurality of first shielding parts arranged in parallel and a plurality of second shielding part groups arranged in parallel; the plurality of first shielding parts are extended along a first direction; each of the plurality of second shielding part groups is extended along a second direction different from the first direction; each of the plurality of second shielding part groups includes a plurality of second shielding parts extended along the second direction; each of the plurality of second shielding parts is disposed between adjacent first shielding parts and is in seamless connection with the adjacent first shielding parts; the plurality of first shielding parts and the plurality of second shielding parts are intersected with each other to surround and define each opening region; and in each of the plurality of opening regions, the protrusion is protruded towards the opening region on a side of the first shielding part and/or the second shielding part facing the opening region.

For example, in the mask provided by at least one embodiment of the present disclosure, the first direction is perpendicular to the second direction.

For example, in the mask provided by at least one embodiment of the present disclosure, in each of the plurality of opening regions, the protrusion is protruded towards the opening region in a middle region on a side of the first shielding part and/or the second shielding part facing the opening region.

For example, in the mask provided by at least one embodiment of the present disclosure, the plurality of fixing parts of the mask are respectively disposed in extension directions of the plurality of first shielding parts and the plurality of second shielding part groups.

For example, in the mask provided by at least one embodiment of the present disclosure, in a protruding direction of the protrusion, at least one through hole corresponding to the protrusion is formed in the first shielding part and/or the second shielding part disposed on an edge; and an extension direction of the through hole is perpendicular to the protruding direction of the protrusion.

For example, in the mask provided by at least one embodiment of the present disclosure, a shape of the through hole is a same with a shape of the protrusion; and a size of the through hole is a same with a size of the protrusion.

For example, in the mask provided by at least one embodiment of the present disclosure, in a protruding direction of the protrusion, a plurality of through holes corresponding to the protrusion are formed in the first shielding part and/or the second shielding part disposed on an edge; and the plurality of through holes are arranged to be spaced from each other along the protruding direction of the protrusion.

At least one embodiment of the present disclosure provides a fine metal mask, the fine metal mask is configured to be cooperated with the mask according to any one embodiment of the present disclosure, the fine metal mask is strip-shaped; the fine metal mask includes a mask pattern region and shielding connecting parts; in an extension direction of the strip-shaped fine metal mask, the shielding connecting parts are respectively disposed at both ends of the mask pattern region; the mask pattern region includes a plurality of through holes arranged in an array; and at least one opening is formed in the shielding connecting part.

For example, in the fine metal mask provided by at least one embodiment of the present disclosure, the at least one opening includes a plurality of openings; and the plurality of openings are arranged to be spaced from each other along the extension direction of the strip-shaped fine metal mask and parallel to each other.

At least one embodiment of the present disclosure provides a mask device, the mask device comprises a support frame and the mask according to any one embodiment of the present disclosure, and the mask is fixed on the support frame.

For example, in the mask device provided by at least one embodiment of the present disclosure, a plurality of connecting grooves are formed in the support frame; and the plurality of fixing parts of the mask are respectively inserted into and fixed in the plurality of connecting grooves.

For example, in the mask device provided by at least one embodiment of the present disclosure, the support frame surrounds the at least one opening region.

For example, the mask device provided by at least one embodiment of the present disclosure further comprises a fine metal mask, and the fine metal mask is strip-shaped and includes a mask pattern region and shielding connecting parts; in an extension direction of the strip-shaped fine metal mask, the shielding connecting parts are respectively disposed at both ends of the mask pattern region; the mask pattern region includes a plurality of through holes arranged in an array; at least one opening is formed in the shielding connecting part; the shielding connecting part of the fine metal mask is disposed on a side of the mask away from the support frame through the fixing part of the mask; an orthographic projection of the opening region of the mask on the fine metal mask is within the mask pattern region and covers the plurality of through holes of the mask pattern region; the through holes formed on the mask are within an orthographic projection of the shielding connecting part on the mask; and an orthographic projection of the at least one opening of the shielding connecting part on the mask is not overlapped with the through hole formed on the mask.

For example, in the mask device provided by at least one embodiment of the present disclosure, the orthographic projection of the at least one opening of the shielding connecting part on the mask and the through hole formed on the mask are alternately arranged along an extension direction of the strip-shaped fine metal mask.

For example, in the mask device provided by at least one embodiment of the present disclosure, the orthographic projection of the shielding connecting part of the fine metal mask on the mask is not overlapped with the opening region of the mask.

For example, in the mask device provided by at least one embodiment of the present disclosure, the plurality of opening regions of the mask are arranged in an array; the mask pattern region of the fine metal mask covers one column or one row of opening regions; and orthographic projections of the one column or one row of opening regions on the fine metal mask are within the mask pattern region.

At least one embodiment of the present disclosure provides a use method of a mask device, the use method comprises forming a film layer on a substrate by utilization of the mask device according to any one embodiment of the present disclosure.

For example, in the use method provided by at least one embodiment of the present disclosure, a surface of the mask device provided with the recessed portion faces the substrate; or a surface of the mask device provided with the recessed portion is away from the substrate.

At least one embodiment of the present disclosure provides a manufacturing method of a mask, the manufacturing method comprises: providing a shielding part including a main part and at least one protrusion, in which the shielding part surrounds and defines at least one opening; in each opening region of the at least one opening region, the protrusion is protruded towards the opening region on a side of the main part facing the opening region; and forming a thinning portion, in which the main part includes an edge which is disposed on a side of the protrusion opposite to the opening region and of which an extension direction is a same with an extension direction of the protrusion; the thinning portion is disposed in at least one of the protrusion and a portion of the main part disposed between the edge and the protrusion; and a thickness of the thinning portion is less than a thickness of other portions of the shielding part.

For example, in the manufacturing method provided by at least one embodiment of the present disclosure, the forming the thinning portion includes: forming a recessed portion on at least one of the protrusion and the portion of the main part disposed between the edge and the protrusion, in which a thickness of a portion of the shielding part at the recessed portion is less than a thickness of other portions of the shielding part.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. Likewise, the term, such as "an", "a", "the" or the like, does not intended to limit the number, but indicates at least one. The terms, such as "comprise/comprising," "include/including," or the like are intended to specify that the elements or the objects stated before these terms encompass the elements or the objects and equivalents thereof listed after these terms, but not preclude other elements or objects.

In the actual process of manufacturing an electronic display product, functional layers, structural layers or the like in the electronic display product are usually formed on a substrate by utilization of a mask device through a method such as deposition or evaporation. In the process of forming a functional layer or a structural layer with irregular shape or special shape, a mask used for forming the functional layer or the structural layer in the mask device may be correspondingly deformed on the basis of an original structure.

Figure 1A:
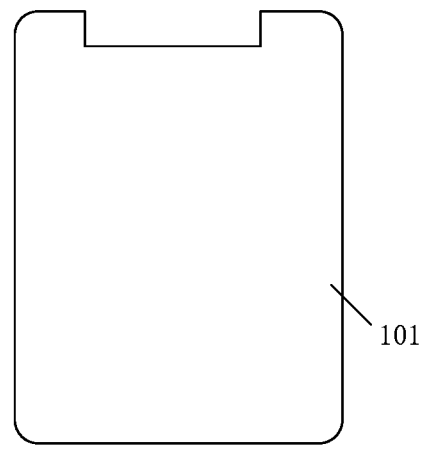
FIG. 1A is a schematic diagram of a film layer required to be formed.
Figure 1B:
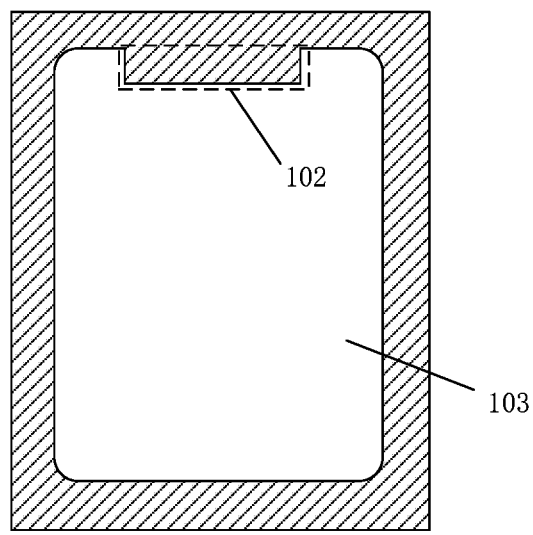
FIG. 1B is a schematic diagram illustrating a local structure of a mask in a mask device.

For instance, taking the case of forming a film layer 101 with special shape as shown in FIG. 1A as an example, FIG. 1B is a schematic diagram illustrating a local structure of a mask in a mask device. For instance, as shown in FIG. 1B, a protrusion 102 (for example, a notch region, which is named because it corresponds to a notch in the film layer 101) is designed in the mask so that a shape of an opening 103 of the mask is the same with a shape of the film layer 101 as shown in FIG. 1A, and then the film layer 101 as shown in FIG. 1A may be formed on a substrate by utilization of a mask device including the mask through a method such as evaporation or deposition.

However, in the process of stretching and tightening the mask, the mask is usually prone to cause the problems such as deformation, twisting and uneven stretching due to overlarge deformation. When a structure of the mask needs to include the notch region (for example, the protrusion 102 as shown in FIG. 1B), due to the presence of the notch region, a stress generated in the process of tightening the mask will change when conducted in the notch region, so the stress change in the notch region is uneven, and then the notch region of the mask is more prone to cause upwarp or sagging at different degrees after stretching and tightening. For instance, as the stress change in the notch region is uneven, the protrusion 102 as shown in FIG. 1B easily tends to cause sagging in the process of stretching and tightening the mask, and large sag amount tends to be produced. In the process of forming the film layer 101 by utilization of the mask device including the mask, due to overlarge sag amount of the protrusion 102 of the mask, abnormalities such as excessive evaporation or excessive deposition tend to occur at an edge of the film layer 101 formed on the substrate, and then an overlarge shadow region will be produced at the edge of the film layer 101. Therefore, a display product including the film layer 101 cannot or can be difficult to realize narrow-frame design.

Moreover, when the sag amount of the protrusion 102 of the mask is severely overlarge, evaporation or deposition materials may also be evaporated or deposited into other adjacent openings in the mask, so a film layer formed by utilization of other openings of the mask is severely adversely affected. Thus, when the display product including the film layer cannot realize narrow-frame design, the performance of the display product will also be severely adversely affected, so the yield of the display product is reduced, resulting in the risk of product reliability failure.

At least one embodiment of the present disclosure provides a mask. A self-weight of the protrusion of the mask or a portion of the mask corresponding to the protrusion can be reduced by the thinning design of the protrusion (such as the notch region) or the portion corresponding to the protrusion, so as to improve the stress distribution condition of the protrusion, thereby weakening the sagging phenomenon of the protrusion after the mask is stretched and tightened, and obviously improving the precision of the mask. Therefore, in the process of forming the film layer or a panel by utilization of the mask device including the mask, the risk of increasing the shadow regions at the edge of the formed film layer or the formed panel can be avoided or alleviated, and the quality of the film layer or the panel formed by utilization of the mask device is improved, thereby improving the yield of a product including the film layer or the panel, reducing the risk of product reliability failure, and being favorable for realizing the narrow-frame design of the product.

Hereafter, some embodiments of the present disclosure will be described below in detail with reference to the accompanying drawings. It should be noted that the same reference numbers in different drawings are used for indicating the same elements that have been described.

At least one embodiment of the present disclosure provides a mask, which comprises at least one opening region and a shielding part surrounding and defining the at least one opening region. The shielding part includes a main part and at least one protrusion. In each opening region of the at least one opening region, the protrusion is protruded towards the opening region on a side of the main part facing the opening region. The main part includes an edge which is disposed on a side of the protrusion opposite to the opening region and of which the extension direction is the same with an extension direction of the protrusion. At least one of the protrusion and a portion of the main part located between the edge and the protrusion includes a thinning portion. A thickness of the thinning portion is less than a thickness of other portions of the shielding part.

In the case of ensuring that a shape of the opening region defined by the shielding part is the same with a shape of the film layer or the panel required to be formed, because the thinning portion of which the thickness is less than the thickness of other portions of the shielding part is disposed in at least one of the protrusion and the portion of the main part located between the edge and the protrusion, the mask provided by the embodiment of the present disclosure can effectively improve the stress distribution of the protrusion, can also reduce the self-weight of the protrusion or the weight of a portion corresponding to the protrusion, weaken or avoid the sagging phenomenon of the protrusion after the mask is stretched and tightened, and obviously improve the precision of the mask.

Illustratively, the description that the protrusion includes the thinning portion of which the thickness is less than the thickness of other portions of the shielding part may be that: an overall thickness of the protrusion is less than a thickness of the main part; or the protrusion not only includes the thinning portion but also includes other portions having different thicknesses with the thinning portion, and the thickness of the main part and the thickness of other portions of the protrusion may be equal and may also be slightly different, and no limitation will be given here in the embodiment of the present disclosure. When the thickness of the main part is equal to the thickness of other portions of the protrusion, being less than the thickness of other portions of the shielding part means being less than the thickness of other portions of the protrusion and being less than the thickness of the main part. When the thickness of the main part and the thickness of other portions of the protrusion are slightly different, being less than the thickness of other portions of the shielding part means being less than the thickness of a portion with a smaller thickness in the main part and other portions of the protrusion.

Alternatively, when the thickness of the main part is slightly different from the thickness of other portions of the protrusion, the thickness of the thinning portion may also be set to be only less than the thickness of other portions of the protrusion except the thinning portion or only less than the thickness of the main part, and the sagging problem of the mask can be reduced as long as the protrusion includes a portion with reduced thickness.

Illustratively, the description that the portion of the main part located between the edge and the protrusion includes the thinning portion of which the thickness is less than the thickness of other portions of the shielding part may be that: the thickness of the thinning portion of the main part is less than the thickness of other portions of the main part and the thickness of the protrusion; and the thickness of other portions of the main part except the thinning portion and the thickness of the protrusion may be equal and may also be slightly different, and no limitation will be given here in the embodiment of the present disclosure.

Illustratively, the description that both the protrusion and the portion of the main part located between the edge and the protrusion include the thinning portion of which the thickness is less than the thickness of other portions of the shielding part may be that: both the thickness of the portion of the main part located between the edge and the protrusion and the thickness of the protrusion are less than the thickness of other portions of the shielding part; and the thickness of the portion of the main part located between the edge and the protrusion and the thickness of the protrusion may be equal and may also be slightly different, and no limitation will be given herein the embodiment of the present disclosure.

Therefore, in the process of forming the film layer or the panel by utilization of the mask device including the mask, a size of the shadow region at the edge of the formed film layer or the formed panel can be reduced, and then the risk of increasing the shadow regions can be avoided or weakened. Thus, the effect of the manufacturing process can be obviously improved, for example, the evaporation effect or the deposition effect is obviously improved, thereby improving the quality of the film layer or the panel formed by utilization of the mask device, improving the yield of a display device including the film layer or the panel, reducing or avoiding the risk of product reliability failure, and being favorable for realizing the narrow-frame design of the display device.

In some embodiments, the main part of the mask may be a latticed structure formed by, for example, a plurality of mask strips intersecting horizontally and vertically, so as to define a plurality of opening regions arranged in an array. For instance, each opening region includes the same shape, that is, in each opening region, the protrusion is protruded towards the opening region from the same position of the main part and has the same shape. Thus, a plurality of film layers or panels having the same shape may be simultaneously formed by utilization of the mask provided by the embodiment of the present disclosure. Therefore, the utilization rate of the mask is improved, and the process cost is reduced.

Detailed description will be given below to the structure and the functions of the mask provided by some embodiments of the present disclosure by taking the mask used for forming the film layer 101 as shown in FIG. 1A as an example.

Figure 2A:
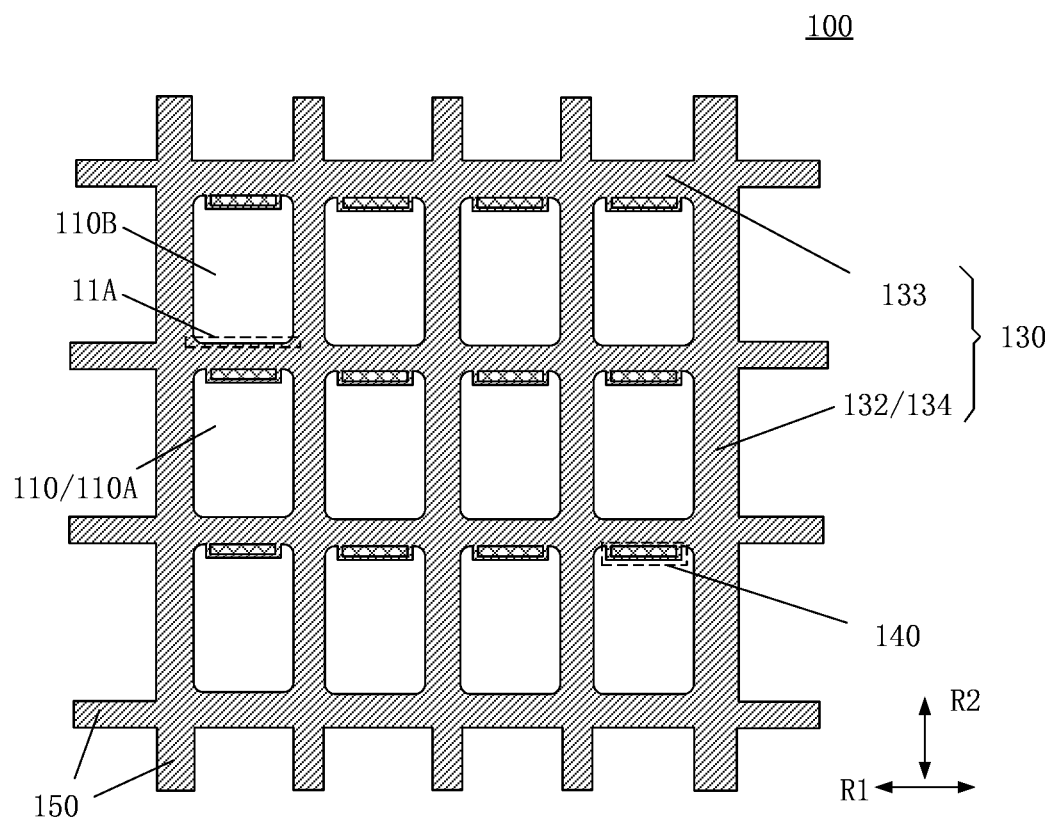
FIG. 2A is a schematic structural view of a mask provided by some embodiments of the present disclosure.
Figure 2B:
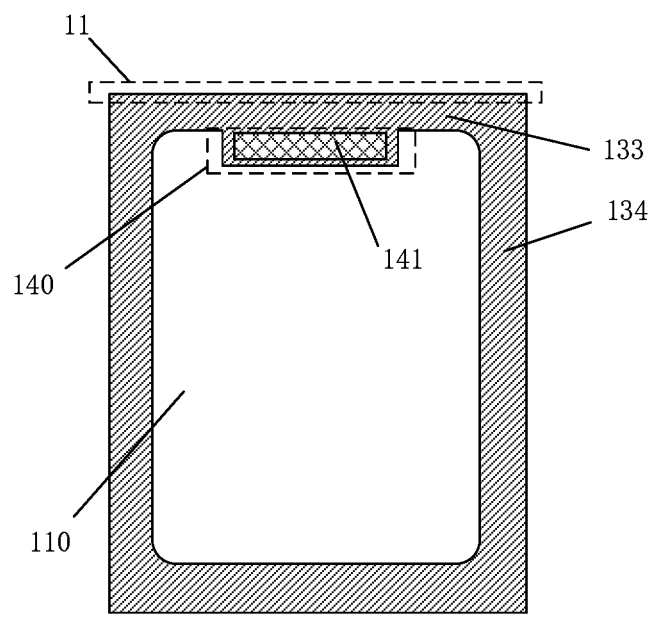
FIG. 2B is a schematic diagram illustrating a local structure of the mask as shown in FIG. 2A.

FIG. 2A is a schematic structural view of a mask provided by some embodiments of the present disclosure. FIG. 2B is a schematic diagram illustrating a local structure of the mask as shown in FIG. 2A.

For instance, as shown in FIGS. 2A and 2B, a mask 100 comprises at least one opening region 110 and a shielding part surrounding and defining the opening region 110. The shielding part includes a main part 130 and a protrusion 140. In each opening region 110, the protrusion 140 is protruded towards the opening region 110 on a side of the main part 130 facing the opening region 110. The protrusion 140 includes a thinning portion, and a thickness of the thinning portion is less than a thickness of other portions of the shielding part.

As shown in FIGS. 2A and 2B, each opening region 110 is defined by the shielding part surrounding the opening region. As for the opening region 110 disposed in the middle and not disposed at an edge of the mask 110, the shielding parts corresponding to adjacent opening regions 110 are connected with each other and have no boundary, and the shielding parts between the adjacent opening regions 110 are shared. For instance, an edge 11 of the shielding part corresponding to one opening region 110, which is disposed on a side of the protrusion 140 opposite to the opening region 110 and of which the extension direction is the same with the extension direction of the protrusion 140, may be an inner edge of the adjacent opening region 110. For instance, an edge 11A of the shielding part corresponding to an opening region 110A, which is disposed on a side of the protrusion 140 opposite to the opening region 110 and of which the extension direction is the same with the extension direction of the protrusion 140, may be an inner edge of an opening region 110B.

For instance, in the embodiment as shown in FIGS. 2A and 2B, a recessed portion 141 is formed on the protrusion 140; the thinning portion of the protrusion 140 is the recessed portion 141; the thickness of a portion of the protrusion 140 at the recessed portion 141 is less than the thickness of the main part 130; and then the protrusion 140 includes the portion of which the thickness is less than the thickness of the main part 130 through the design of the recessed portion 141. As the recessed portion 141 (such as a groove) is formed in the protrusion 140, the mask 100 can effectively improve the stress distribution condition of the protrusion 140 and reduce the self-weight of the protrusion 140, thereby weakening or avoiding the sagging phenomenon of the protrusion 140 after the mask 100 is stretched and tightened, and obviously improving the precision of the mask 140.

For instance, the recessed portion 141 may be, for example, a groove structure. For instance, a recessed direction of the recessed portion 141 is perpendicular to a surface of the mask 100, namely perpendicular to a plane on which the mask 100 is located or a plane parallel to the plane on which the mask 100 is located.

Alternatively, in the embodiment of the present disclosure, only an upper surface or a lower surface of the protrusion may include the thinning portion, or both the upper surface and the lower surface of the protrusion may include the thinning portion. For instance, the recessed portion may be formed on both the upper surface and the lower surface of the protrusion, so the stress distribution condition of the protrusion can be more effectively improved.

It should be noted that in the embodiment as shown in FIGS. 2A and 2B, the recessed portion 141 is the thinning portion of the protrusion 140, and the protrusion 140 not only includes the recessed portion 141 but also includes other portions of which the thickness is different from the thickness of the recessed portion 141, that is, the protrusion 140 not only includes the thinning portion but also includes other portions. Moreover, in some other embodiments of the present disclosure, the entire protrusion may be the thinning portion, that is, the overall thickness of the protrusion is less than the thickness of the main part, so the self-weight of the protrusion can also be reduced, and then the stress distribution condition of the protrusion can be improved, thereby weakening or avoiding the sagging phenomenon of the protrusion after the mask is stretched and tightened.

It should be noted that in the embodiment as shown in FIGS. 2A and 2B, the thickness of other portions of the protrusion 140 except the recessed portion 141 and the thickness of the main part 130 may be equal and may also be slightly different. For instance, when the thickness of other portions of the protrusion 140 except the recessed portion 141 is equal to the thickness of the main part 130, a forming depth of the recessed portion 141 is not only less than the thickness of other portions of the protrusion 140 but also less than the thickness of the main part 130; when the thickness of other portions of the protrusion 140 except the recessed portion 141 is greater than the thickness of the main part 130, the forming depth of the recessed portion 141 needs to be less than the thickness of the main part 130; and when the thickness of other portions of the protrusion 140 except the recessed portion 141 is less than the thickness of the main part 130, the forming depth of the recessed portion 141 needs to be less than the thickness of other portions of the protrusion 140. The specific value of the forming depth of the recessed portion 141 may be set according to different actual demands, for instance, may be adjusted according to the specific structure of the shielding part or the stress distribution condition of the protrusion 140. No limitation will be given here in the embodiment of the present disclosure.

For instance, a ratio of a thickness of a portion of the shielding part at the recessed portion 141 to a thickness of other portions of the shielding part is greater than or equal to 0.8, moreover, may be greater than or equal to 0.9, that is, a ratio of the forming depth of the recessed portion 141 to the thickness of other portions of the shielding part is less than or equal to 0.2, moreover, may be less than or equal to 0.1.

For instance, a range of the forming depth of the recessed portion 141 may be 10 μm-80 μm.

For instance, as shown in FIGS. 2A and 2B, a center of an orthographic projection of the recessed portion 141 on the protrusion 140 may coincide with a center of the protrusion 140, for example, may be roughly coincident, and a shape of the recessed portion 141 and a shape of the protrusion 140 may be the same, so as to more effectively improve the stress distribution condition of the protrusion 140, thereby better weakening or avoiding the sagging phenomenon of the protrusion 140 after the mask 100 is stretched and tightened, and more significantly improving the precision of the mask 100.

For instance, the description that the center of the orthographic projection of the recessed portion 141 on the protrusion 140 and the center of the protrusion 140 may coincide refers to that a connecting line between a center of a cross section of the recessed portion 141 parallel to a surface of the mask 100 and the center of the protrusion 140 is perpendicular to the surface of the mask 100.

Alternatively, the center of the orthographic projection of the recessed portion 141 on the protrusion 140 and the center of the protrusion 140 may also be not coincident, or the shape of the recessed portion 141 and the shape of the protrusion 140 may also be different. No limitation will be given here in the embodiment of the present disclosure. For instance, the recessed portion may also be set to be in other regular shapes such as square and regular hexagon or in irregular shapes. For instance, an opening may be formed at a end of a side surface of the recessed portion.

Alternatively, in some other embodiments of the present disclosure, the thinning portion may also be a plurality of recessed portions formed in the protrusion. For instance, the plurality of recessed portions may be connected with each other and may also be Discretely separated. For instance, the plurality of recessed portions may be block-shape and are arranged in a matrix or in other array forms, or the plurality of recessed portions may also be strip-shaped and spaced from each other. No limitation will be given here in the embodiment of the present disclosure.

It should be noted that description is given in the embodiment of the present disclosure by taking the process of forming the film layer 101 as shown in FIG. 1A as an example, so the shape of the protrusion 140 is set to be rectangular, so as to cooperate with the main part 130 to define the opening region 110 having the same shape with the film layer 101. Moreover, in some other embodiments of the present disclosure, the protrusion 140 may also be correspondingly set to be in other appropriate shapes according to different shapes of the film layer or the panel required to be formed.

In some embodiments, the shape of the protrusion may also be semicircular, drop-shaped, etc.

Figure 3A:
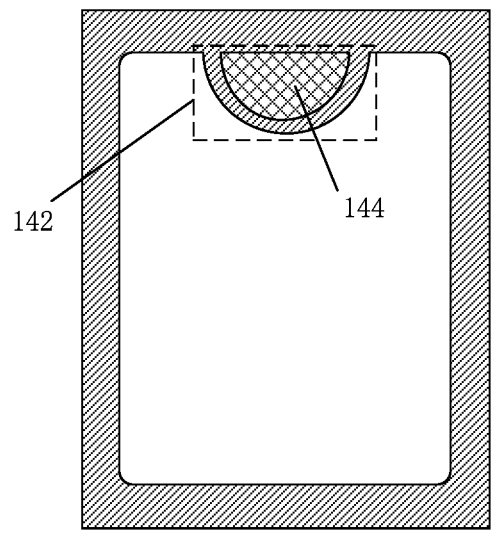
FIGS. 3A and 3B are schematic diagrams illustrating a local structure of another mask provided by some embodiments of the present disclosure.
Figure 3B:
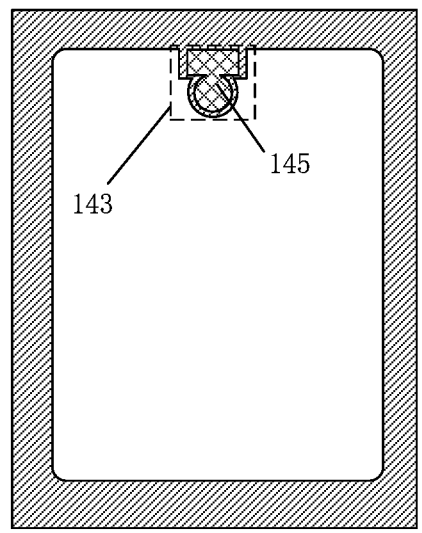

For instance, in some other embodiments of the present disclosure, the mask may include a semicircular protrusion 142 as shown in FIG. 3A, may also include a protrusion 143 which is in an irregular shape that is approximately circular as shown in FIG. 3B, and may also include a protrusion having other regular shapes such as square or regular hexagon or other irregular shapes such as drop-shaped. No limitation will be given here in the embodiment of the present disclosure. For instance, according to different actual shapes of the protrusion, in the case that the recessed portion is formed in the protrusion so that the protrusion includes a portion of which the thickness is less than the thickness of the main part, a forming position, the shape and the size of the recessed portion may be correspondingly adjusted and set according to actual shape and size of the protrusion. For instance, as shown in FIG. 3A, a protrusion 142 may be provided with a recessed portion 144 of which a center of an orthographic projection on the protrusion 142 coincides with or roughly coincides with a center of the protrusion 142 and the shape is the same with the shape of the protrusion 142; or as shown in FIG. 3B, a protrusion 143 may be provided with a recessed portion 145 of which a center of an orthographic projection on the protrusion 143 coincides with or roughly coincides with the center of the protrusion 143 and the shape is the same with the shape of the protrusion 143.

For instance, in the embodiment as shown in FIGS. 2A and 2B, the mask 100 may include a plurality of opening regions 110; the plurality of opening regions 110 are arranged in an array; and the shielding part surrounds and defines each opening region 110 in the plurality of opening regions 110, so that the shape of each opening region 110 is the same with the shape of the film layer 101 required to be formed.

It should be noted that the number and the arrangement mode of the opening regions 110 as shown in FIG. 2A are only illustrative, and the number and the arrangement mode of the opening regions 110 disposed in the mask 100 are not limited in the embodiment of the present disclosure. In actual condition, the shape of the opening regions, the number of the opening regions, the arrangement mode of the plurality of opening regions, and the like may be determined by those skilled in the art according to different actual conditions. For instance, in some other embodiments of the present disclosure, the mask 100 may also be set to include less or more opening regions 110. For instance, the mask 100 may also be only provided with one opening region 110. For instance, the plurality of opening regions may be arranged in a plurality of rows, and the first column of the opening region in each row may be staggered at a certain distance relative to the first column of the opening region in the last row, for example, a staggered distance may be half of the width of the opening region; or the first column of the opening region in each row is staggered at a certain distance relative to the first column of the opening region in an adjacent row. No limitation will be given here in the embodiment of the present disclosure.

It should be noted that an overall shape of the film layer 101 as shown in FIG. 1A is approximately square, so in the embodiment as shown in FIGS. 2A and 2B, the overall shape of the opening region 110 is also approximately square. And in some other embodiments of the present disclosure, the opening region may also be correspondingly designed to be in other different shapes according to different shapes of the film layer or the panel required to be formed. For instance, the overall shape of each opening region surrounded and defined by the shielding part may also be approximately a regular shape such as circular or regular hexagon or an irregular shape. No limitation will be given here in the embodiment of the present disclosure.

For instance, as shown in FIGS. 2A and 2B, according to a shape of the opening region 110 required to be formed, the shielding part may include a plurality of first shielding parts 133 disposed in parallel and a plurality of second shielding part groups 132 arranged in parallel in the same plane; the plurality of first shielding parts 133 are extended along a first direction R1; each of the plurality of second shielding part groups 132 is extended along a second direction R2 different from the first direction R1; each second shielding part group 132 includes a plurality of second shielding parts 134 extended along the second direction R2; each second shielding part 134 is disposed between adjacent first shielding parts 133 and is in seamless connection with the adjacent first shielding parts 133; and the plurality of first shielding parts 133 and the plurality of second shielding part groups 132 are intersected with each other to surround and define each opening region 110.

Alternatively, the first shielding part 133 and the second shielding part 134 may be in seamless connection at an intersection of the first shielding part 133 and the second shielding part 134.

For instance, in the embodiment as shown in FIGS. 2A and 2B, according to the shape of the film layer 101 required to be formed, the first shielding part 133 and the second shielding part 134 define the opening region 110 of which the shape is approximately rectangular. Corresponding to each opening region 110, a size of the first shielding part 133 in the first direction R1 is less than a size of the second shielding part 134 in the second direction R2.

It should be noted that description is given in the embodiment of the present disclosure by taking the process of forming the film layer 101 as shown in FIG. 1A as an example, but this does not constitute a limitation on the embodiment of the present disclosure. For instance, in some other embodiments of the present disclosure, according to different shapes of the film layers or the panels required to be formed, a positional relationship between the first shielding part and the second shielding part (for example, an included angle between the first shielding part and the second shielding part), extension directions and shapes and the like of the first shielding part and the second shielding part may be correspondingly adjusted so that the shape of the formed opening region is the same with the shape of the film layer or the panel required to be formed.

For instance, as shown in FIGS. 2A and 2B, in each opening region 110, the protrusion 140 is protruded towards the opening region 110 in a middle region on a side of the first shielding part 133 facing the opening region 110, so as to be cooperated with the first shielding part 133 and the second shielding part 134 to form the opening region 110 of which the shape is the same with the shape of the film layer 101.

For instance, in the embodiment as shown in FIGS. 2A and 2B, in each opening region 110, a size of the protrusion 140 in the first direction R1 is less than a size of the first shielding part 133 in the first direction R1.

It should be noted that according to different shapes of the film layers or the panels required to be formed, during designing the opening region, in some other embodiments of the present disclosure, a plurality of protrusions may also be correspondingly arranged in each opening region; or in some other embodiments of the present disclosure, the protrusion may also be disposed on a side of the second shielding part facing the opening region; or in some other embodiments of the present disclosure, the protrusion may be disposed on both a side of the first shielding part facing the opening region and a side of the second shielding part facing the opening region. No limitation will be given here in the embodiment of the present disclosure.

For instance, in some embodiments of the present disclosure, the protrusion may be integrally formed with the main part, so the manufacturing process of the mask is simplified and the production cost of the mask is reduced. For instance, in the embodiment as shown in FIGS. 2A and 2B, the protrusion 140 may be integrally formed with the first shielding part 133 of the main part 130, namely integrally formed with the first shielding part 133.

It should be noted that in the embodiment as shown in FIG. 2A, the second shielding part 134 may be integrally formed with the first shielding part 133 and the protrusion 140, for instance, may be simultaneously stretched and tightened, so as to be favorable for adjusting the tightening precision of the mask 100 and controlling the tightening deformation of the mask 100, and then the first shielding part 133 and the second shielding part 134 can realize more stable structure after fixed with, for example, a support frame, thereby being favorable for prolonging the service life of the mask 100. Or the second shielding part 134 may also be respectively formed with the first shielding part 133 and the protrusion 140. For instance, the first shielding part 133 and the second shielding part 134 may be respectively and independently manufactured, and then intersected and fixed on, for example, the support frame by, for example, welding or other means, for example, may be welded in a corresponding welding groove on the support frame. No limitation will be given here in the embodiment of the present disclosure.

For instance, as shown in FIG. 2A, the mask 100 further comprises a plurality of fixing parts 150 disposed at the periphery of the shielding part. The plurality of fixing parts 150 are connected with the shielding part and are protruded along a direction away from the plurality of opening regions 110 in a plane parallel to a surface of the mask 100. For instance, in the embodiment as shown in FIG. 2A, the plurality of fixing parts 150 of the mask 100 are respectively disposed in extension directions of the plurality of first shielding parts 133 and the plurality of second shielding part groups 132, that is, respectively disposed in extension directions of the plurality of first shielding parts 133 and the plurality of second shielding parts 134.

For instance, when the mask 100 is tightened and stretched, the mask may be fixed on, for example, the support frame through the plurality of fixing parts 150 to form the mask device used for forming the film layer or the panel. For instance, the plurality of fixing parts 150 may be directly fixed on a surface of the support frame or fixed in a corresponding welding groove on the support frame by, for example, welding or other manners. For instance, in the embodiment as shown in FIG. 2A, the plurality of first shielding parts 133 and the second shielding parts 134 in the plurality of second shielding part groups 132 of the mask 100 may be respectively fixed on the support frame through the plurality of fixing parts 150.

For instance, in some embodiments of the present disclosure, the fixing part 150 may be integrally formed with the shielding part (for example, the first shielding part 133 and the second shielding part 134), so as to further simplify the manufacturing process of the mask 100 and reduce the production cost of the mask 100.

For instance, in the embodiment as shown in FIGS. 2A and 2B, a material of the shielding part of the mask 100 may include a metallic material, for example, may include a metallic material with high thermal stability and small thermal expansion coefficient, such as invar and stainless steel, so that it is favorable for the main part 130 and the protrusion 140 of the mask 100 to maintain relatively the high ability of resisting the deformation. For instance, in some other embodiments of the present disclosure, the shielding part may also include other rigid materials or other appropriate materials. No limitation will be given here in the embodiment of the present disclosure.

For instance, the film layer 101 formed by utilization of the mask device including the mask 100 as shown in FIGS. 2A and 2B, for instance, may be at least one of a hole transport layer (HTL), an electron transport layer (ETL), a hole injection layer (HIL), an electron injection layer (EIL), a hole blocking layer (HBL), an electron blocking layer (EBL) and a cathode layer in a display element.

For instance, when the film layer 101 required to be formed is at least one of a light emission layer and an anode layer in the display element, the film layer may be formed by utilization of the mask device including the mask 100 as shown in FIGS. 2A and 2B and, for example, a Fine Metal Mask (FMM) cooperated with the mask 100.

Figure 4A:
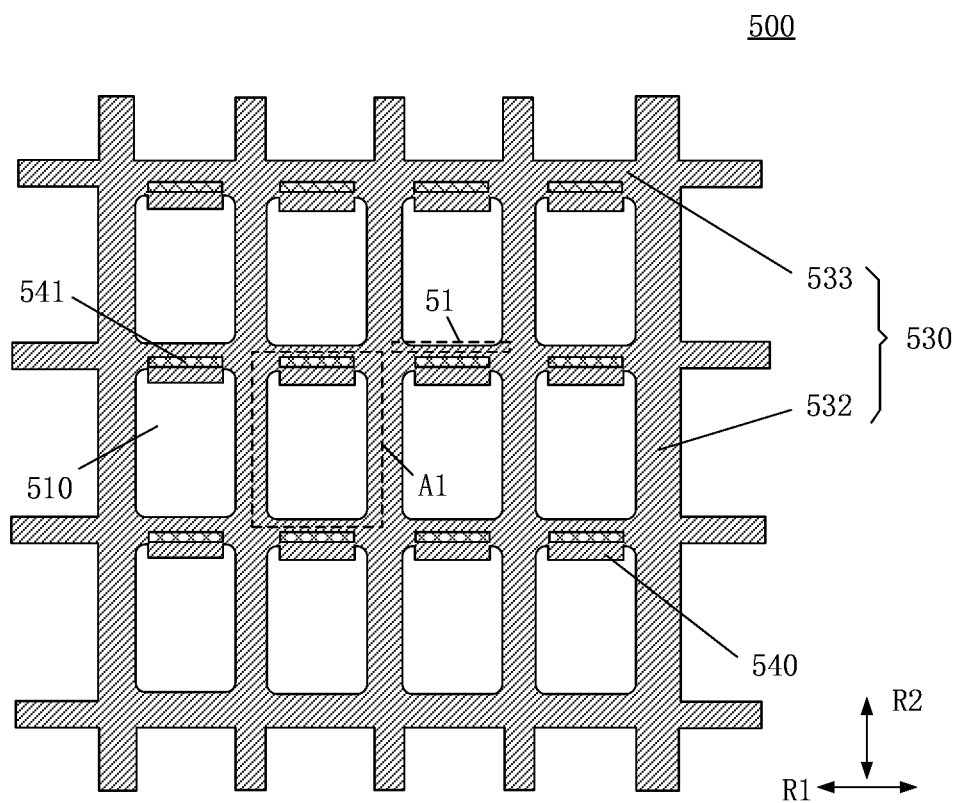
FIG. 4A is a schematic structural view of another mask provided by some embodiments of the present disclosure.
Figure 4B:
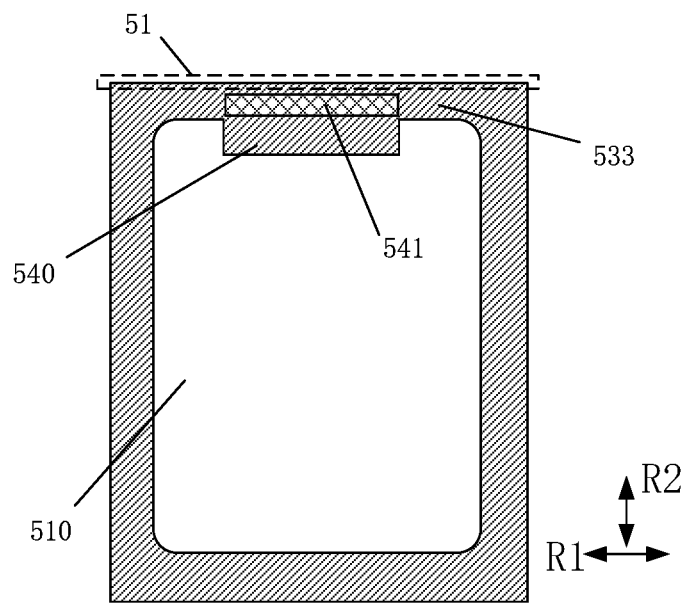
FIG. 4B is a schematic diagram illustrating a local structure of the mask as shown in FIG. 4A.

FIG. 4A is a schematic structural view of another mask provided by some embodiments of the present disclosure. FIG. 4B is a schematic diagram illustrating a local structure of the mask as shown in FIG. 4A.

It should be noted that except a recessed portion 541, other structures of the mask as shown in FIG. 4A are all basically the same with or similar to the mask 100 as shown in FIG. 2A, and no further description will be given here.

For instance, with reference to FIGS. 4A and 4B, a mask 500 comprises an opening region 510 and a shielding part surrounding and defining the opening region 510. The shielding part includes a main part 530 (including a plurality of first shielding parts 533 and a plurality of second shielding part groups 532) and a protrusion 540. In each opening region 510, the protrusion 540 is protruded towards the opening region 510 on a side of the main part 530 facing the opening region 510. The main part 530 includes an edge 51 which is disposed on a side of the protrusion 540 opposite to the opening region 510 and of which an extension direction is the same with an extension direction of the protrusion 540. A portion of the main part 530 located between the edge 51 and the protrusion 540 includes a thinning portion, and a thickness of the thinning portion is less than a thickness of other portions of the shielding part.

For instance, the thinning portion is a recessed portion 541, namely the recessed portion 541 is formed in a portion of the main part 530 located between the edge 51 and the protrusion 540. A thickness of a portion of the shielding part at the recessed portion 541 is less than a thickness of other portions of the shielding part.

Thus, a weight of the portion of the main part 530 located between the edge 51 and the protrusion 540 is reduced due to a design of the recessed portion 541, so as to effectively improve the stress distribution condition of the protrusion 540, weaken or avoid the sagging phenomenon of the protrusion 540 after the mask 500 is stretched and tightened, and obviously improve the precision of the mask 540.

Figure 4C:
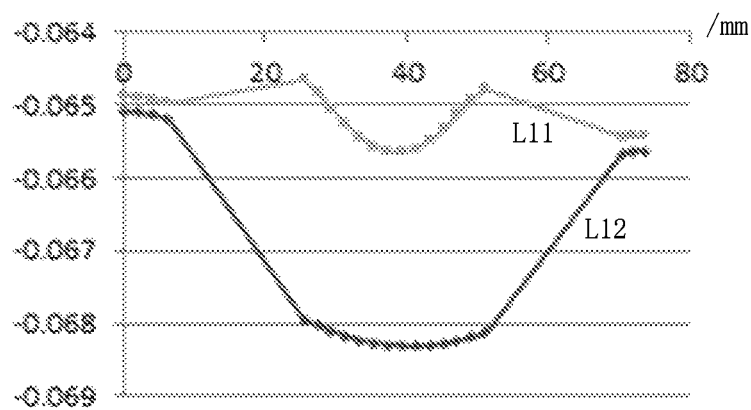
FIG. 4C is a schematic diagram illustrating the sag amount of the local structure of the mask as shown in FIG. 4B.

For instance, taking the case that FIG. 4B is a schematic diagram illustrating a local structure of the mask 500 as shown in FIG. 4A at an A1 position as an example, FIG. 4C is a schematic diagram illustrating sag amounts of the first shielding part 533 and the protrusion 540 as shown in FIG. 4B.

For instance, with reference to FIGS. 4B and 4C, L11 refers to the sag amounts of the first shielding part 533 at various positions along a first direction R1, and L12 refers to the sag amounts of the protrusion 540 at various positions along the first direction RE For instance, when the protrusion 540 is 70 mm-80 mm, a sag amount of a central region of the first shielding part 533 is about 0.0657 mm; a sag amount of a central region of the protrusion 540 is about 0.0683 mm; and the difference between the sag amount of the central region of the first shielding part 533 and the sag amount of the central region of the protrusion 540 is only about 0.004 mm Compared with the case that the thinning portion is not disposed in the shielding part, the difference is reduced by about 85%.

For instance, with reference to FIGS. 4A and 4B, a connecting line between a center of an orthographic projection of the recessed portion 541 on the protrusion 540 and a center of the protrusion 540 is parallel to a protruding direction of the protrusion 540, that is, a center line of the recessed portion 541 along a second direction R2 and a center line of the protrusion 540 along the second direction R2 are basically on the same straight line, so as to more effectively improve the stress distribution condition of the protrusion 540, further weaken or avoid the sagging phenomenon of the protrusion 540 after the mask 500 is stretched and tightened, and more significantly improve the precision of the mask 500.

For instance, as shown in FIGS. 4A and 4B, in the first direction R1, a size of the recessed portion 541 is basically the same with a size of the protrusion 540, and the shape of the recessed portion 541 is the same with the shape of the protrusion 540. In some other embodiments of the present disclosure, in the first direction R1, the size of the recessed portion 541 may also be slightly greater than or slightly less than the size of the protrusion 540. No limitation will be given here in the embodiment of the present disclosure.

For instance, a ratio of the size of the recessed portion 541 in the first direction R1 to the size in the second direction R2 may be 10:1-12:1. For instance, when the size of the recessed portion 541 in the first direction R1 is 30 mm-35 mm, the size of the recessed portion 541 in the second direction R2 may be 2 mm-3 mm.

For instance, in the embodiment as shown in FIGS. 4A and 4B, a shape of the recessed portion 541 is rectangular; and in some other embodiments of the present disclosure, the shape of the recessed portion 541, for example, may also be other regular shapes such as square or sector or irregular shapes.

Figure 5A:
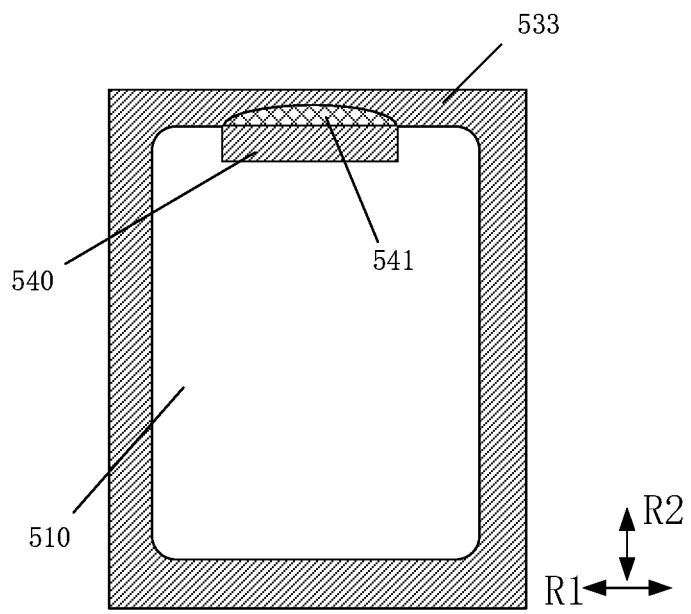
FIG. 5A is a schematic diagram illustrating a local structure of another mask provided by some embodiments of the present disclosure.
Figure 5B:
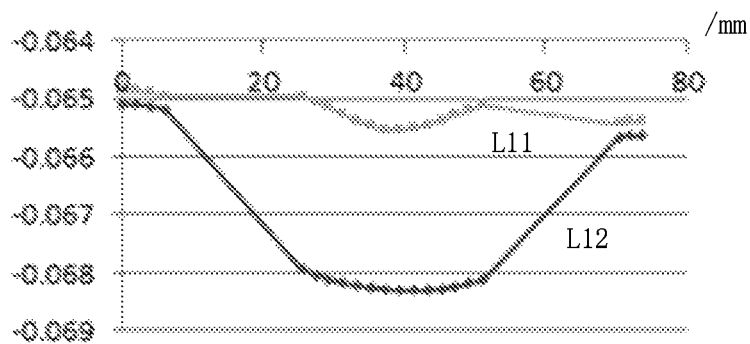
FIG. 5B is a schematic diagram illustrating the sag amount of the local structure of the mask as shown in FIG. 5A.

In some embodiments, as shown in FIG. 5A, the shape of the recessed portion 541 may be sector. A ratio of a radius of the sector to the size of the recessed portion 541 in the second direction R2 may be 9:1-11:1. Moreover, with reference to FIG. 5B, a difference between the sag amount of the central region of the first shielding part 533 and the sag amount of the central region of the protrusion 540 is also only about 0.004 mm, and is reduced by about 85% compared with the case that the thinning portion is not disposed in the shielding part. In addition, as shown in FIG. 5B, compared with the sag amount distribution case as shown in FIG. 4C, when the recessed portion 541 is sector, the sag amount distributions of the first shielding part 533 and the protrusion 540 are more uniform, so as to further weaken or avoid the sagging phenomenon of the protrusion 540 after the mask 500 is stretched and tightened.

Figure 6:
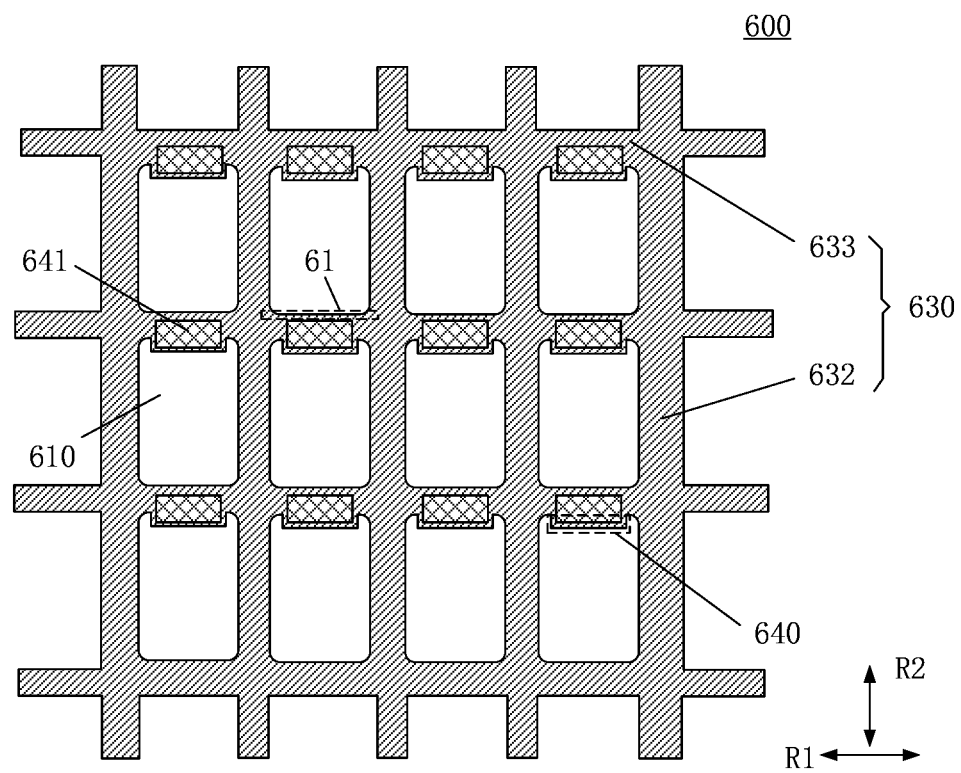
FIG. 6 is a schematic structural view of still another mask provided by some embodiments of the present disclosure.

FIG. 6 is a schematic structural view of still another mask provided by some embodiments of the present disclosure. It should be noted that except a recessed portion 641, other structures of a mask 600 as shown in FIG. 6 are basically the same with or similar to the mask 100 as shown in FIG. 2A or the mask 500 as shown in FIG. 4A. No further description will be given here.

For instance, as shown in FIG. 6, the mask 600 comprises an opening region 610 and a shielding part surrounding and defining the opening region 610. The shielding part includes a main part 630 (including a plurality of first shielding parts 633 and a plurality of second shielding part groups 632) and a protrusion 640. In each opening region 610, the protrusion 640 is protruded towards the opening region 610 on a side of the main part 630 facing the opening region 610. The main part 630 includes an edge 61 which is disposed on a side of the protrusion 640 opposite to the opening region 610 and of which the extension direction is the same with a extension direction of the protrusion 640. Both the protrusion 640 and a portion of the main part 630 located between the edge 61 and the protrusion 640 include a thinning portion, and a thickness of the thinning portion is less than a thickness of other portions of the shielding part.

For instance, a recessed portion 641 is disposed in the protrusion 640 and the portion of the main part 630 located between the edge 61 and the protrusion 640 and is taken as the thinning portion. The thickness of a portion of the shielding part at the recessed portion 641 is less than the thickness of other portions of the shielding part.

For instance, the thinning portions in the protrusion 640 and the portion of the main part 630 located between the edge 61 and the protrusion 640 are communicated with each other.

Thus, both a weight of the portion of the main part 630 located between the edge 61 and the protrusion 640 and a self-weight of the protrusion 540 are reduced due to the design of the recessed portion 641, so as to more effectively improve the stress distribution condition of the protrusion 640, weaken or avoid the sagging phenomenon of the protrusion 640 after the mask 600 is stretched and tightened, and obviously improve the precision of the mask 640.

For instance, in the embodiment as shown in FIG. 6, a forming depth of the recessed portion 641 in the portion of the main part 630 located between the edge 61 and the protrusion 640 is the same with a forming depth of the recessed portion in the protrusion 640; and in some other embodiments of the present disclosure, the forming depth of the recessed portion 641 in the portion of the main part 630 located between the edge 61 and the protrusion 640 may also be different from the forming depth of the recessed portion in the protrusion 640. No limitation will be given here in the embodiment of the present disclosure.

It should be noted that in the embodiment as shown in FIG. 6, the overall shape of the recessed portion 641 is rectangular; and in some other embodiments of the present disclosure, the shape of the recessed portion 641, for example, may also be other regular shapes such as square, sector, ellipse, regular hexagon or octagon or irregular shapes. No limitation will be given here in the embodiment of the present disclosure.

It should be noted that in the embodiment as shown in FIG. 6, when both the protrusion 640 and the portion of the main part 630 located between the edge 61 and the protrusion 640 include the thinning portion, the thinning portion of the portion of the main part 630 located between the edge 61 and the protrusion 640 is communicated with the thinning portion of the protrusion 640 to form the recessed portion 641; and in some other embodiments of the present disclosure, when both the protrusion 640 and the portion of the main part 630 located between the edge 61 and the protrusion 640 include the thinning portion, the thinning portions of both may also be not connected or communicated with each other. For instance, two non-communicated recessed portions are respectively formed in the protrusion 640 and the portion of the main part 630 located between the edge 61 and the protrusion 640 and taken as the thinning portions. No limitation will be given here in the embodiment of the present disclosure.

For instance, the mask provided by the embodiment of the present disclosure may be independently used, for example, may be used for forming at least one of the at least one of a hole transport layer (HTL), an electron transport layer (ETL), a hole injection layer (HIL), an electron injection layer (EIL), a hole blocking layer (HBL), an electron blocking layer (EBL), a cathode layer and the like in the display element, and may also be taken as a support mask and, for example, cooperated with the Fine Metal Mask (FMM) (as described below) provided by some embodiments of the present disclosure, for example, may be used for forming at least one of the light emission layer and the anode layer of the display element. No limitation will be given here in the embodiment of the present disclosure.

For instance, in some embodiments of the present disclosure, in a protruding direction of the protrusion, at least one through hole corresponding to the protrusion is formed in the first shielding part and/or the second shielding part disposed on an edge, and an extension direction of the through hole is perpendicular to the protruding direction of the protrusion. For instance, taking the case that a shape of the protrusion is rectangular as an example, the extension direction of the through hole may be the same with an extension direction of the protrusion, namely the same with a direction of a long side of the rectangle. Therefore, the embodiment can be favorable for the stress conduction of the mask in the process of tightening and welding the mask, further improve the stress distribution condition of the protrusion, more obviously weaken or more effectively avoid the sagging phenomenon of the protrusion after the mask is stretched and tightened, and further improve the precision of the mask.

Figure 7A:
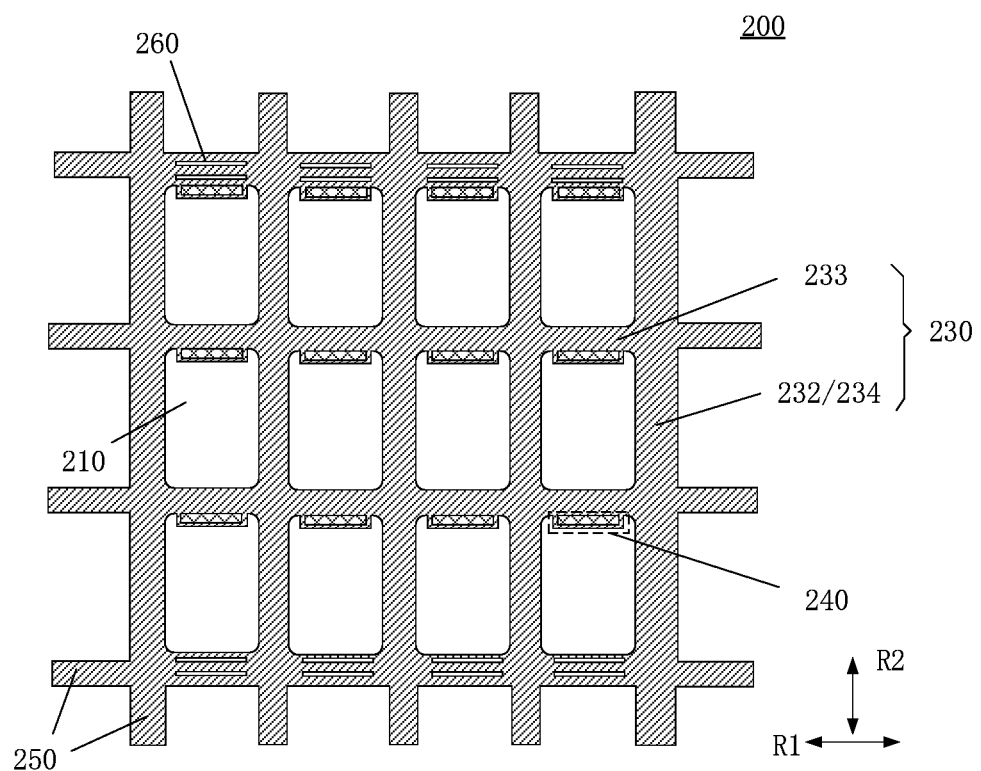
FIG. 7A is a schematic structural view of still another mask provided by some embodiments of the present disclosure.
Figure 7B:
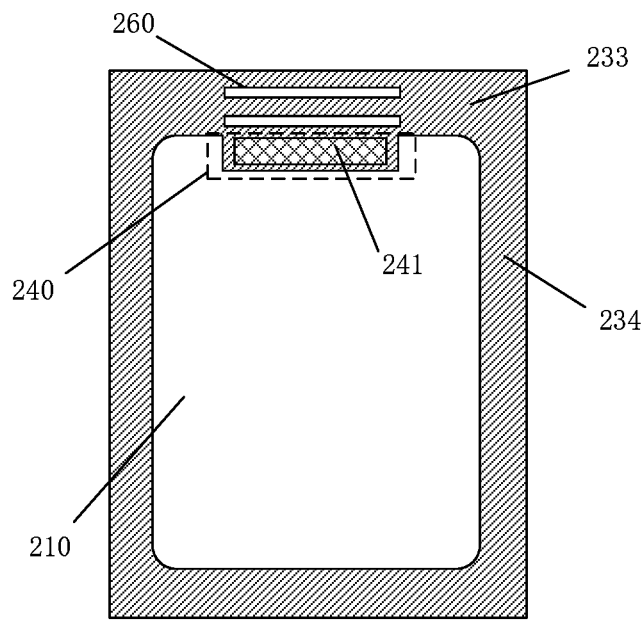
FIG. 7B is a schematic diagram illustrating a local structure of the mask as shown in FIG. 7A.

FIG. 7A is a schematic structural view of still another mask provided by some embodiments of the present disclosure. FIG. 7B is a schematic diagram illustrating a local structure of the mask as shown in FIG. 7A.

It should be noted that except that a through hole 260 is formed, other structures of a mask 200 as shown in FIG. 7A are all basically the same with or similar to the mask 100 as shown in FIG. 2A. No further description will be given here.

For instance, with reference to FIGS. 7A and 7B, a main part 230 of the mask 200 includes a plurality of first shielding parts 233 extended along a first direction R1 and a plurality of second shielding part groups 232 extended along a second direction R2; each second shielding part group 232 includes a plurality of second shielding parts 234 extended along the second direction R2; and each second shielding part 234 is disposed between adjacent first shielding parts 233 and is in seamless connection with the adjacent first shielding parts 233. The main part 230 is provided with a plurality of through holes 260 corresponding to the protrusion 240 in the first shielding parts 233 of the main part 230 at both ends in the protruding direction (such as the second direction R2) of the protrusion 240. The extension direction of the through hole 260 is perpendicular to the protruding direction of the protrusion 240. For instance, the extension direction of the through hole 260 is the same with the extension direction of the protrusion 240. For instance, as shown in FIG. 7A, both the extension direction of the through hole 260 and the extension direction of the protrusion 240 are the first direction R1.

For instance, on the basis that the protrusion 240 is provided with the recessed portion 241, the plurality of through holes 260 formed in the first shielding parts 233 at both ends of the mask 200 can be favorable for the stress conduction along the second direction R2 when the mask 200 is stretched and tightened, thus improving the uniformity of stress change of the protrusion 240, further improving the stress distribution condition of the protrusion 240, and further weakening or avoiding the sagging phenomenon of the protrusion 240 after the mask 200 is stretched and tightened.

Alternatively, in some other embodiments of the present disclosure, the extension direction of the through hole may also be not the same with the extension direction of the protrusion. For instance, the through hole may be formed to be not parallel to the protrusion, but an included angle is formed between both. For instance, a range of the included angle is 0-15°. No limitation will be given here in the embodiment of the present disclosure.

For instance, in the embodiment as shown in FIGS. 7A and 7B, centers of the through holes 260 and centers of corresponding column of protrusions 240 are arranged on the same straight line; and in some other embodiments of the present disclosure, in the second direction R2, the centers of the through holes 260 may also be staggered at a certain distance from the centers of corresponding column of protrusions 240. No limitation will be given here in the embodiment of the present disclosure.

For instance, when the formed film layer 101 as shown in FIG. 1 is, for example, the light emission layer and the anode layer in the display element, the mask 200 is taken as a support mask and is overlapped and cooperated with a Fine Metal Mask (such as a high-precision metal mask). For instance, taking the high-precision metal mask as an example, in the process of forming the film layer 101, the high-precision metal mask may shield the through hole 260 in the mask 200, so as to avoid the case that excessive materials are evaporated or deposited to the substrate through the through hole 260 during, for example, evaporation or deposition.

For instance, a shape of the through hole 260 may be the same with a shape of the protrusion 240, and a size of the through hole 260 is the same with a size of the protrusion 240, so as to be more favorable for the stress conduction of the mask 200 along the second direction R2 when the mask 200 is stretched and tightened, and improve the uniformity of stress change of the mask 200.

Alternatively, in some other embodiments of the present disclosure, the shape of the through hole may be not the same with the shape of the protrusion. For instance, when the protrusion is set to be in other shapes such as circular or semicircular as required, the through hole may also be still set to be, for example, strip-shaped, so as to provide convenience for processing. For instance, in the first direction R1 or the second direction R2, the size of the through hole may also be slightly greater than or slightly less than the size of the protrusion. No limitation will be given here in the embodiment of the present disclosure.

For instance, the shape of the through hole may be continuous strip as shown in FIG. 7A or FIG. 7B, and may also be discrete strips divided into a plurality of segments, or the through holes may also be a plurality of discrete points, etc. For instance, the through hole may be in a regular shape such as regular hexagon or circular and may also be in an irregular shape. For instance, the plurality of through holes may be strip-shaped and be spaced from each other, and may also be dot-shaped or segment-shaped and are arranged in a matrix or in other array forms. No limitation will be given here in the embodiment of the present disclosure.

For instance, as shown in FIGS. 7A and 7B, the plurality of through holes 260 are arranged to be spaced from each other along the protruding direction (such as the second direction R2) of the protrusion 240. For instance, as the high-precision metal mask always is strip-shaped, a plurality of openings are usually formed on both sides of the high-precision metal mask, so as to adjust the stress distribution of the high-precision metal mask, and weaken or avoid the problem of deformation or twisting when the high-precision metal mask is stretched and tightened. When the mask is overlapped and cooperated with the high-precision metal mask, as the plurality of through holes 260 are arranged to be spaced from each other along the protruding direction of the protrusion 240, the plurality of through holes 260 and openings formed in the high-precision metal mask may be alternately arranged. Therefore, the high-precision metal mask can shield the through hole 260 of the mask 200, so as to avoid the case that excessive materials are evaporated or deposited to the substrate through the through holes 260 during, for example, evaporation or deposition.

It should be noted that in the embodiment of the present disclosure as shown in FIGS. 7A and 7B, two through holes 260 corresponding to each column of protrusions 240 are formed in the first shielding parts 233 of the main part 230 of the mask 200 at both ends in the protruding direction (such as the second direction R2) of the protrusion 240, that is, two rows of through holes 260 are respectively formed in the first shielding parts 231 at both ends. And in some other embodiments of the present disclosure, in the protruding direction of the protrusion, only one through hole corresponding to each column of protrusions may also be formed in the first shielding parts at both ends of the mask, that is, one row of through holes are respectively formed in the first shielding parts at both ends of the mask. Or in some other embodiments of the present disclosure, in the protruding direction of the protrusion, three or more through holes corresponding to each column of protrusions may also be formed in the first shielding parts at both ends of the mask. No limitation will be given here in the embodiment of the present disclosure.

It should be noted that in the embodiment of the present disclosure as shown in FIGS. 7A and 7B, a through hole 260 corresponding to each column of protrusions 240 is formed in the first shielding parts 233 of the main part 230 of the mask 200 at both ends in the protruding direction (such as the second direction R2) of the protrusion 240, and the number of the formed through holes 260 for both ends are same. And in some other embodiments of the present disclosure, according to different actual demands, in the protruding direction of the protrusion, the number of the through holes respectively formed in the first shielding parts at both ends of the mask may also be different. For instance, the through hole may also be only formed in the first shielding part at one end of the mask, and the through hole is not formed in the first shielding part at the other end. No limitation will be given here in the embodiment of the present disclosure.

For instance, in the process of forming the film layer 101 as shown in FIG. 1, the mask 200 needs to be cooperated with the fine metal mask such as the high-precision metal mask, and the formed film layer 101 may be at least one of the light emission layer and the anode layer of the display element.

Figure 8A:
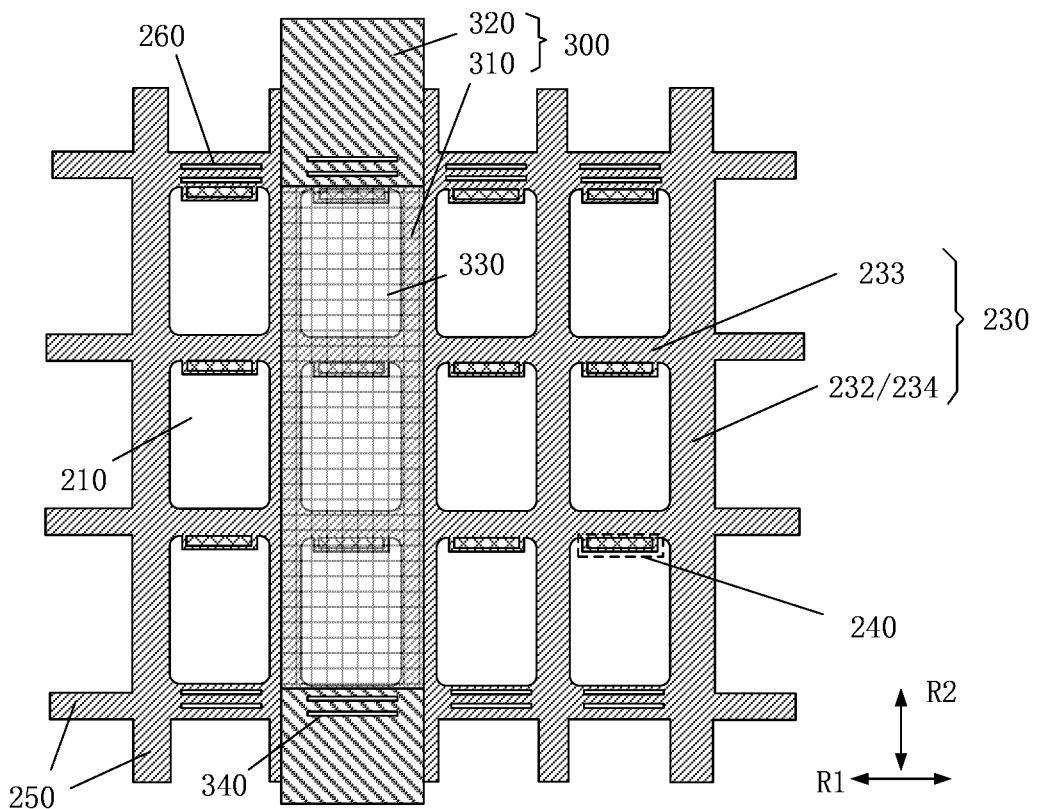
FIG. 8A is a schematic diagram illustrating an overlap setting of the mask as shown in FIG. 7A and a fine metal mask.
Figure 8B:
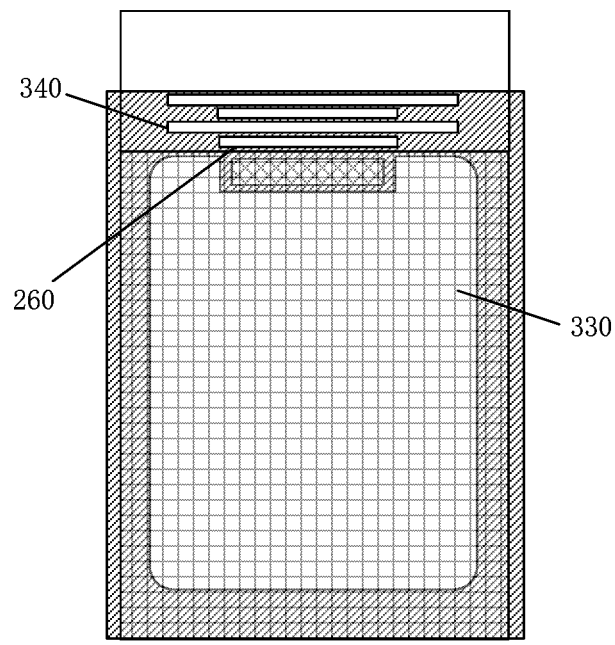
FIG. 8B is a schematic partial view of an overlap setting structure as shown in FIG. 8A.

FIG. 8A is a schematic diagram illustrating the overlap setting of the mask as shown in FIG. 7A and the fine metal mask such as the high-precision metal mask. FIG. 8B is a schematic partial view of an overlap setting structure as shown in FIG. 8A.

For instance, with reference to FIGS. 8A and 8B, a fine metal mask 300 is strip-shaped, and includes a mask pattern region 310 and a shielding connecting part 320. In an extension direction (such as the second direction R2) of the strip-shaped fine metal mask 300, the shielding connecting part 320 is respectively disposed at both ends of the mask pattern region 310.

For instance, the mask pattern region 310 includes a plurality of through holes 330 arranged in an array. For instance, the plurality of through holes 330 correspond to a plurality of pixel units arranged in an array in the display element. When the mask 200 is overlapped and cooperated with the fine metal mask 300, an orthographic projection of the opening region 210 of the mask 200 on the fine metal mask 300 is within the mask pattern region 310 and covers the plurality of through holes 330. Thus, in the process of forming the film layer 101, a material may be evaporated or deposited to a substrate through the plurality of through holes 330.

For instance, as the fine metal mask 300 is strip-shaped, a plurality of openings 340 are usually formed in the shielding connecting parts 320 on both sides of the fine metal mask 300, so as to adjust the stress distribution of the fine metal mask 300, and weaken or avoid the problem of deformation or twisting when the fine metal mask 300 is stretched and tightened. When the mask 200 is overlapped and cooperated with the fine metal mask 300, the through hole 260 formed in the mask 200 is within an orthographic projection of the shielding connecting part 320 on the mask 200, and orthographic projections of the plurality of openings 340 of the shielding connecting part 320 on the mask 200 are not overlapped with the through hole 260. For instance, the orthographic projections of the openings 340 of the shielding connecting part 320 on the mask 200 and the through hole 260 are alternately arranged along the extension direction (such as the second direction R2) of the strip-shaped fine metal mask 300. Thus, in the process of forming the film layer 101, the fine metal mask 300 can shield the through hole 260 of the mask 200, so as to avoid the case that excessive materials are evaporated or deposited to the substrate through the through hole 260 during, for example, evaporation or deposition.

For instance, the plurality of openings 340 are arranged to be spaced from each other and parallel to each other along the extension direction of the strip-shaped fine metal mask 300.

For instance, the orthographic projection of the shielding connecting part 320 of the fine metal mask 300 on the mask 200 is not overlapped with the opening region 210 of the mask 200. Thus, in the process of forming the film layer 101, the adverse effect of the shielding connecting part 320 on, for example, the evaporation, deposition or the like of a material in the opening region 210 can be avoided.

Figure 9:
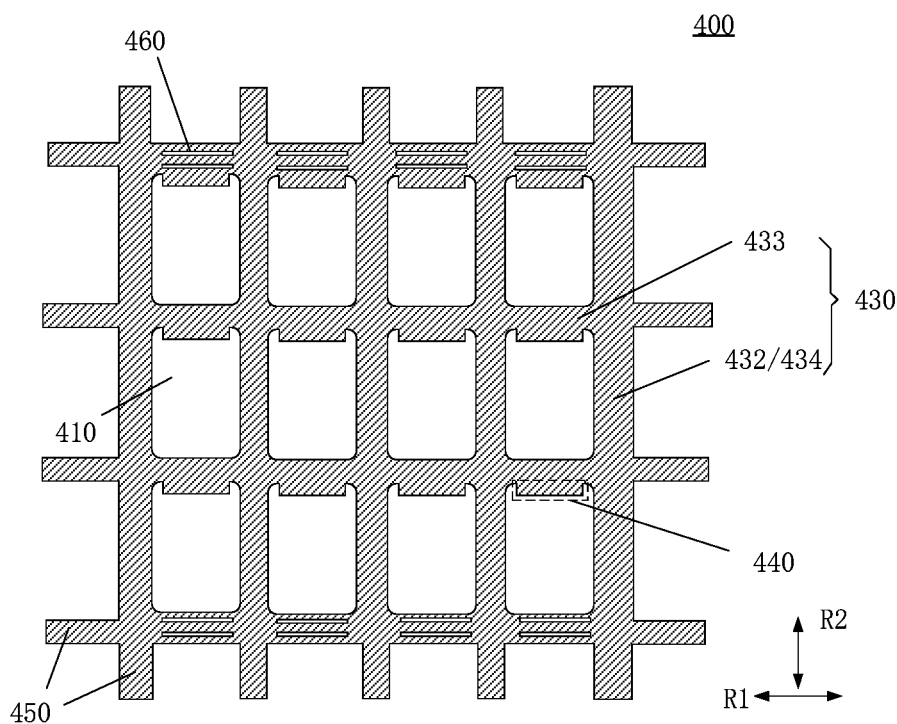
FIG. 9 is a schematic structural view of still another mask provided by some embodiments of the present disclosure.

FIG. 9 is a schematic structural view of still another mask provided by some embodiments of the present disclosure. It should be noted that except that a recessed portion is not formed on a protrusion 440, other structures of a mask 400 as shown in FIG. 9 are basically the same with or similar to the mask 200 as shown in FIG. 7A. No further description will be given here.

For instance, a main part 430 of the mask 400 includes a plurality of first shielding parts 433 extended along a first direction R1 and a plurality of second shielding part groups 432 extended along a second direction R2; each second shielding part group 432 includes a plurality of second shielding parts 434 extended along the second direction R2; and each second shielding part 434 is disposed between adjacent first shielding parts 433 and is in seamless connection with the adjacent first shielding parts 433. In the mask 400 as shown in FIG. 9, a plurality of through holes 460 are respectively formed in the first shielding parts 433 of the mask 400 at both ends along the second direction R2. The plurality of through holes 460 can be favorable for the stress conduction of the mask 400 along the second direction R2 when the mask 400 is stretched and tightened, improve the uniformity of stress change on the protrusion 440, improve the stress distribution condition of the protrusion 440, and weaken or avoid the sagging phenomenon of the protrusion 440 after the mask 400 is stretched and tightened.

At least one embodiment of the present disclosure further provides a fine metal mask, which is configured to be cooperated with the mask provided by any embodiment of the present disclosure. The fine metal mask is strip-shaped, and includes a mask pattern region and a shielding connecting part. In an extension direction of the strip-shaped fine metal mask, the shielding connecting part is respectively disposed at both ends of the mask pattern region. The mask pattern region includes a plurality of through holes arranged in an array, and at least one opening is formed in the shielding connecting part.

In some embodiments, the at least one opening includes a plurality of openings, and the plurality of openings are arranged to be spaced from each other along the extension direction of the fine metal mask and parallel to each other.

For instance, the fine metal mask may be the fine metal mask 300 as shown in FIGS. 8A and 8B and may be configured to be cooperated with the mask 100 as shown in FIG. 2A, the mask 200 as shown in FIG. 7A or the mask 400 as shown in FIG. 9. For instance, the fine metal mask may be a high-precision metal mask.

At least one embodiment of the present disclosure further provides a mask device, which comprises a support frame and the mask provided by any embodiment of the present disclosure. The mask is fixed on the support frame. For instance, the mask may be fixed on the support frame by stretching.

Figure 10:
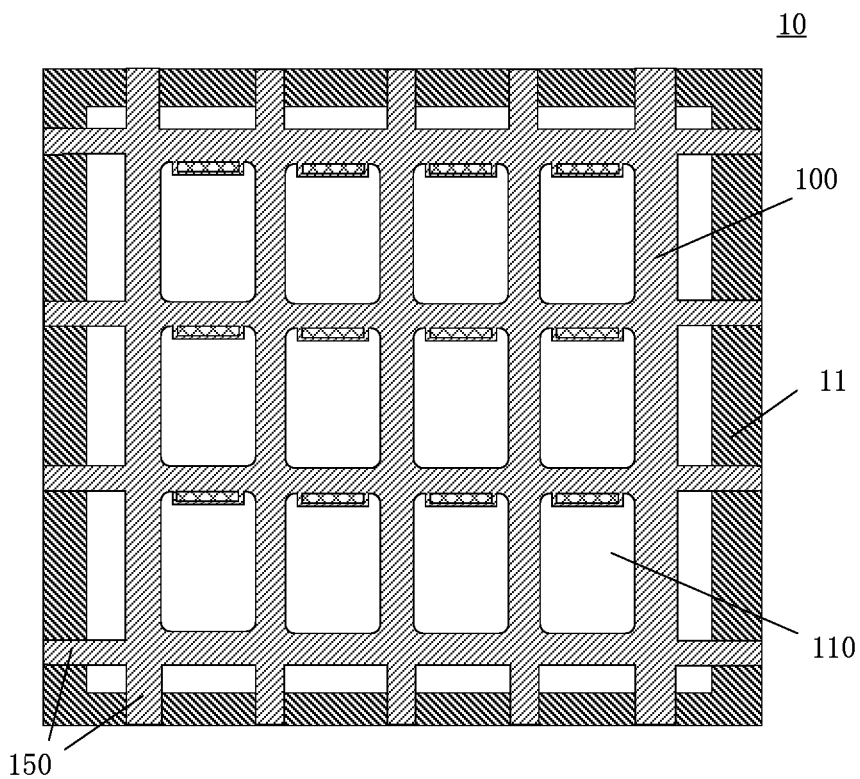
FIG. 10 is a schematic structural view of a mask device provided by some embodiments of the present disclosure.

FIG. 10 is a schematic structural view of a mask device provided by some embodiments of the present disclosure.

For instance, as shown in FIG. 10, a mask device 10 comprises a support frame 11 and the mask 100 as shown in FIG. 2A.

For instance, as shown in FIG. 10, the support frame 11 surrounds the opening region 110 of the mask 100.

For instance, as shown in FIG. 10, a plurality of connecting grooves (not shown) are formed in the support frame 11, and the plurality of fixing parts 150 of the mask 100 are respectively inserted into and fixed in the plurality of connecting grooves.

For instance, the fixing part 150 of the mask 100 may be fixed in the connecting groove by, for example, welding or other manners. The specific process or the specific method adopted for fixing is not limited in the embodiment of the present disclosure.

For instance, in some other embodiments of the present disclosure, the fixing part may also be directly fixed on a surface of the support frame, for example, directly welded on the surface of the support frame. The specific mode or method of fixing the fixing part on the support frame is not limited in the embodiment of the present disclosure.

Figure 11:
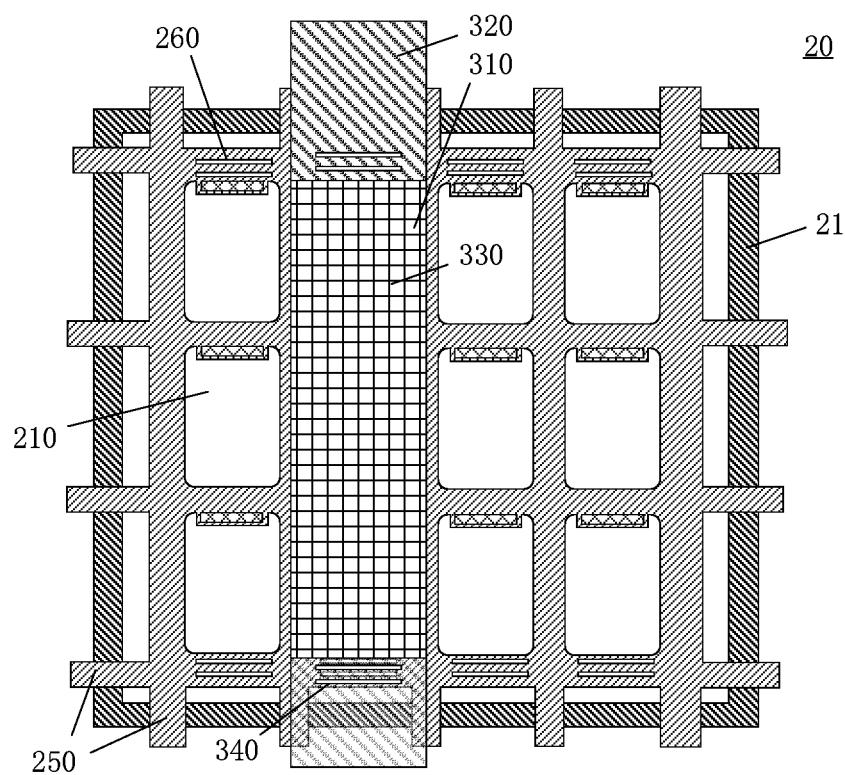
FIG. 11 is a schematic structural view of another mask device provided by some embodiments of the present disclosure.

FIG. 11 is a schematic structural view of another mask device provided by some embodiments of the present disclosure.

For instance, as shown in FIG. 11, a mask device 20 comprises a support frame 21 and the mask 200 and the fine metal mask 300 as shown in FIG. 8A.

For instance, as shown in FIG. 11, a plurality of connecting grooves (not shown) are formed in the support frame 21, and the plurality of fixing parts 250 of the mask 200 are respectively inserted into and fixed in the plurality of connecting grooves.

For instance, the shielding connecting part 320 of the fine metal mask 300 is disposed on a side of the mask 200 away from the support frame 21 through the fixing part 250 of the mask 200.

For instance, an orthographic projection of the opening region 210 of the mask 200 on the fine metal mask 300 is within the mask pattern region 310 and covers the plurality of through holes 330; the plurality of through holes 260 formed in the mask 200 are within an orthographic projection of the shielding connecting part 320 on the mask 200; and an orthographic projection of the opening 340 of the shielding connecting part 320 on the mask 200 is not overlapped with the through hole 260.

For instance, the orthographic projection of the opening 340 of the shielding connecting part 320 on the mask 200 and the through hole 260 are alternately arranged along the extension direction of the strip-shaped fine metal mask 300.

For instance, the orthographic projection of the shielding connecting part 320 of the fine metal mask 300 on the mask 200 is not overlapped with the opening region 210 of the mask 200.

For instance, the mask pattern region 310 of the fine metal mask 300 covers one column or one row of opening regions 210 of the mask 200, and orthographic projections of the one column or one row of opening regions 210 on the fine metal mask 300 are within the mask pattern region 310.

For instance, the support frame 21 surrounds the opening region 210 and the mask pattern region 310.

For instance, in the mask device 10 and the mask device 200 provided by some embodiments of the present disclosure as shown in FIGS. 10 and 11, the support frame 11 and the support frame 21 are square frame. And in some other embodiments of the present disclosure, the support frame 11 and the support frame 21 may also be in other appropriate shapes, for example, other regular shapes such as rhombic or circular or irregular shapes. No limitation will be given here in the embodiment of the present disclosure.

For instance, the material of the support frame 11 and the support frame 21 may include a metallic material with high thermal stability and small thermal expansion coefficient, such as invar and stainless steel.

For instance, in some embodiments of the present disclosure as shown in FIG. 10 or FIG. 11, taking the mask device 20 as shown in FIG. 11 as an example, in a direction perpendicular to a main surface of the support frame 21, a depth of the connecting groove is basically equal to or slightly greater than a thickness of the mask 200, so a surface of the mask 200 away from the support frame 21 and a main surface of the support frame 21 may be basically in the same plane. For instance, in actual manufacturing process, both a size of the mask 200 and a size of the connecting groove have certain precision error. In order to ensure that a size of the fixing part 250 of the mask 200 can be completely accommodated into and be fixed in corresponding connecting groove, a width of each connecting groove may be slightly greater than a width of corresponding fixing part 250 of the mask 200. No limitation will be given here in the embodiment of the present disclosure.

At least one embodiment of the present disclosure further provides a use method of a mask device. The use method comprises: forming a film layer on a substrate by utilization of the mask device provided by any embodiment of the present disclosure.

For instance, in some embodiments of the present disclosure, a surface of the mask device provided with the recessed portion faces the substrate, or a surface of the mask device provided with the recessed portion is away from the substrate.

For instance, in some embodiments of the present disclosure, the film layer 101 as shown in FIG. 1 may be formed on the substrate by utilization of the mask device 10 as shown in FIG. 10 or the mask device 20 as shown in FIG. 11.

For instance, the film layer 101 formed by utilization of the display device 10 as shown in FIG. 10 may be at least one of a hole transport layer (HTL), an electron transport layer (ETL), a hole injection layer (HIL), an electron injection layer (EIL), a hole blocking layer (HBL), an electron blocking layer (EBL) and a cathode layer in a display element; and the film layer 101 formed by utilization of the display device 20 as shown in FIG. 11 may be at least one of a light emission layer and an anode layer of the display element.

For instance, in some embodiments of the present disclosure, the mask device provided by the embodiment of the present disclosure may be utilized to form a film layer or a panel in a device with display function such as an organic light-emitting diode (OLED) display device, a quantum light-emitting diode (QLED) display device or an e-paper display device or in other types of devices, and the film layer may be a structural layer, a functional layer, etc. No limitation will be given here in the embodiment of the present disclosure.

For instance, the device manufactured by utilization of the mask device may be a product or a component with display function such as a display substrate, a display panel, e-paper, a mobile phone, a tablet PC, a TV, a display, a notebook computer, a digital album or a navigator. No limitation will be given here in the embodiment of the present disclosure.

At least one embodiment of the present disclosure further provides a manufacturing method of a mask. The manufacturing method comprises: providing a shielding part including a main part and at least one protrusion, in which the shielding part surrounds and defines at least one opening region; in each opening region of the at least one opening region, the protrusion is protruded towards the opening region on a side of the main part facing the opening region; and forming a thinning portion, in which the main part includes an edge which is disposed on a side of the protrusion opposite to the opening region and of which an extension direction is the same with an extension direction of the protrusion; the thinning portion is disposed on at least one of the protrusion and a portion of the main part located between the edge and the protrusion; and a thickness of the thinning portion is less than a thickness of other portions of the shielding part.

For instance, in some embodiments of the present disclosure, the forming the thinning portion includes: forming a recessed portion on at least one of the protrusion and the portion of the main part located between the edge and the protrusion. A thickness of a portion of the shielding part at the recessed portion is less than a thickness of other parts of the shielding part.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged or reduces, that is, the accompanying drawings are not drawn according to the actual scale. However, it should be understood that, in the case in which a component or element such as a layer, film, region, substrate or the like is referred to be "on" or "under" another component or element, it may be directly on or under the another component or element or a component or element is interposed therebetween.

(3) In case of no conflict, features in one embodiment or in different embodiments can be combined to obtain a new embodiment.

What are described above is related to the specific embodiments of the disclosure only and not limitative to the scope of the disclosure. The protection scope of the disclosure shall be based on the protection scope of the claims.

The invention claimed is:

1. A mask, comprising: at least one opening region and a shielding part surrounding and defining the at least one opening region,
   wherein the shielding part includes a main part and at least one protrusion,
   in each opening region of the at least one opening region, the protrusion is protruded towards the opening region on a side of the main part facing the opening region,
   the main part includes an edge which is disposed on a side of the protrusion opposite to the opening region and of which an extension direction is a same with an extension direction of the protrusion, at least one of the protrusion and a portion of the main part disposed between the edge and the protrusion includes a thinning portion, and a thickness of the thinning portion is less than a thickness of other portions of the shielding part;

the thinning portion comprises a recessed portion, the recessed portion is between the edge end the protrusion and extends along a same extension direction as the edge, and a maximum length of the recessed portion in the extension direction is substantially equal to a maximum length of the protrusion in the extension direction; the recessed portion has a first end and a second end that are opposite to each other in the extension direction, the protrusion has a first end and a second end that are opposite to each other in the extension direction, the first end of the recessed portion is aligned with the first end of the protrusion, and the second end of the recessed portion is aligned with the second end of the protrusion.

2. The mask according to claim 1, wherein
a connecting line between a center of the recessed portion and a center of the protrusion is parallel to a protruding direction of the protrusion.

3. The mask according to claim 2, wherein a shape of the recessed portion is the same as a shape of the protrusion.

4. The mask according to claim 2, wherein a shape of the recessed portion is different from a shape of the protrusion.

5. The mask according to claim 1, wherein a ratio of the thickness of the portion of the shielding part at the recessed portion to the thickness of other portions of the shielding part is equal to 0.8 to 0.9.

6. The mask according to claim 1, wherein the portion of the main part disposed between the edge and the protrusion is communicated with the thinning portion in the protrusion.

7. The mask according to claim 1, further comprising a plurality of fixing parts disposed at a periphery of the shielding part,
wherein the plurality of fixing parts are connected with the shielding part and are protruded along a direction away from the at least one opening region in a plane parallel to a surface of the mask.

8. The mask according to claim 1, wherein the mask comprises a plurality of opening regions,
wherein the plurality of opening regions are arranged in an array, and the shielding part surrounds and defines each opening region of the plurality of opening regions,
the shielding part includes a plurality of first shielding parts arranged in parallel and a plurality of second shielding part groups arranged in parallel;
each of the plurality of first shielding parts are extended along a first direction; each of the plurality of second shielding part groups is extended along a second direction different from the first direction;
each of the plurality of second shielding part groups includes a plurality of second shielding parts extended along the second direction; each of the plurality of second shielding parts is disposed between adjacent first shielding parts of the plurality of first shielding parts and is in seamless connection with the adjacent first shielding parts;
the plurality of first shielding parts and the plurality of second shielding parts are intersected with each other to surround and define each opening region; and
in each of the plurality of opening regions, the protrusion is protruded towards the opening region on a side of the first shielding part and/or the second shielding part, respectively, facing the opening region.

9. The mask according to claim 8, wherein in each of the plurality of opening regions, the protrusion is protruded towards the opening region in a middle region on a side of the first shielding part and/or the second shielding part, respectively, facing the opening region,
wherein a plurality of fixing parts of the mask are respectively disposed in extension directions of the plurality of first shielding parts and the plurality of second shielding part groups.

10. The mask according to claim 8, wherein in a protruding direction of the protrusion, at least one through hole corresponding to the protrusion is formed in at least one of the plurality of first shielding parts and/or at least one of the plurality of the second shielding parts disposed on an edge; and
an extension direction of the through hole is perpendicular to the protruding direction of the protrusion,
wherein a shape of the through hole is the same as a shape of the protrusion; and a size of the through hole is the same as a size of the protrusion.

11. The mask according to claim 1, wherein the thinning portion is not on the protrusion.

12. A fine metal mask, configured to be cooperated with the mask according to claim 1,
wherein the fine metal mask is strip-shaped;
the fine metal mask includes a mask pattern region and a shielding connecting part;
in an extension direction of the strip-shaped fine metal mask, the shielding connecting part is respectively disposed at both ends of the mask pattern region;
the mask pattern region includes a plurality of through holes arranged in an array; and at least one opening is formed in the shielding connecting part.

13. A mask device, comprising a support frame and the mask according to claim 1,
wherein the mask is fixed on the support frame.

14. The mask device according to claim 13, wherein the mask further comprises a plurality of fixing parts disposed at a periphery of the shielding part, a plurality of connecting grooves are formed in the support frame; and the plurality of fixing parts of the mask are respectively inserted into and fixed in the plurality of connecting grooves.

15. The mask device according to claim 14, further comprising a fine metal mask, wherein the fine metal mask is strip-shaped and includes a mask pattern region and a shielding connecting part; in an extension direction of the strip-shaped fine metal mask, the shielding connecting part is respectively disposed at both ends of the mask pattern region;
the mask pattern region includes a plurality of through holes arranged in an array; at east one opening is formed in the shielding connecting part;
the shielding connecting part of the fine metal mask is disposed on a side of the mask away from the support frame through the fixing part of the mask;
an orthographic projection of the opening region of the mask on the fine metal mask is within the mask pattern region and covers the plurality of through holes of the mask pattern region;
the through holes formed on the mask are within an orthographic projection of the shielding connecting part on the mask; and an orthographic projection of the at least one opening of the shielding connecting part on the mask is not overlapped with the through hole formed on the mask.

16. The mask device according to claim 15, wherein the orthographic projection of the at least one opening of the shielding connecting part on the mask and the through hole formed on the mask are alternately arranged along an extension direction of the strip-shaped fine metal mask.

17. The mask device according to claim 15, wherein the plurality of opening regions of the mask are arranged in an array; the mask pattern region of the fine metal mask covers one column or one row of opening regions; and orthographic projections of the one column or one row of opening regions on the fine metal mask are within the mask pattern region.

18. A use method of a mask device, comprising: forming a film layer on a substrate by utilization of the mask device according to claim 13, wherein a surface of the mask device provided with the recessed portion faces the substrate; or a surface of the mask device provided with the recessed portion is away from the substrate.

19. A manufacturing method of a mask, comprising:

providing a shielding part including a main part and at least one protrusion, in which the shielding part surrounds and defines at least one opening; in each opening region of the at least one opening region, the protrusion is protruded towards the opening region on a side of the main part facing the opening region; and forming a thinning portion, in which the main part includes an edge which is disposed on a side of the protrusion opposite to the opening region and of which an extension direction is a same with an extension direction of the protrusion; the thinning portion is disposed in at least one of the protrusion and a portion of the main part disposed between the edge and the protrusion; and a thickness of the thinning portion is less than a thickness of other portions of the shielding part;

the thinning portion comprises a recessed portion, the recessed portion is between the edge and the protrusion and extends along a same extension direction as the edge, and a maximum length of the recessed portion in the extension direction is substantially equal to a maximum length of the protrusion in the extension direction; the recessed portion has a first end and a second end that are opposite to each other in the extension direction, the protrusion has a first end and a second end that are opposite to each other in the extension direction, the first end of the recessed portion is aligned with the first end of the protrusion, and the second end of the recessed portion is aligned with the second end of the protrusion.

* * * * *